US012588412B2

(12) United States Patent
Iosad

(10) Patent No.: US 12,588,412 B2
(45) Date of Patent: Mar. 24, 2026

(54) THERMOELECTRIC ELEMENT, THERMOELECTRIC GENERATOR, PELTIER ELEMENT, PELTIER COOLER, AND METHODS MANUFACTURING THEREOF

(71) Applicant: Nikolay Iosad, Taunusstein (DE)

(72) Inventor: Nikolay Iosad, Taunusstein (DE)

(73) Assignee: Nikolay Iosad, Westerwaldstrasse (DE)

( * ) Notice: Subject to any disclaimer, the term of this patent is extended or adjusted under 35 U.S.C. 154(b) by 0 days.

(21) Appl. No.: 18/683,054

(22) PCT Filed: Sep. 1, 2022

(86) PCT No.: PCT/EP2022/074397
§ 371 (c)(1),
(2) Date: Feb. 12, 2024

(87) PCT Pub. No.: WO2023/031369
PCT Pub. Date: Mar. 9, 2023

(65) Prior Publication Data
US 2025/0008840 A1     Jan. 2, 2025

(30) Foreign Application Priority Data
Sep. 2, 2021     (DE) ..................... 10 2021 209 656.5

(51) Int. Cl.
*H10N 10/01*     (2023.01)
*H10N 10/17*     (2023.01)
(52) U.S. Cl.
CPC ............. *H10N 10/01* (2023.02); *H10N 10/17* (2023.02)

(58) Field of Classification Search
CPC ............................... H10N 10/01; H10N 10/17
See application file for complete search history.

(56) References Cited

U.S. PATENT DOCUMENTS

| | | | | |
|---|---|---|---|---|
| 3,554,815 A | * | 1/1971 | Osborn | ................ H10N 10/817 |
| | | | | 136/203 |
| 2008/0271772 A1 | * | 11/2008 | Leonov | .................. H10N 10/17 |
| | | | | 136/224 |
| 2015/0034140 A1 | | 2/2015 | Span et al. | |
| 2015/0325765 A1 | | 11/2015 | Iosad | |

FOREIGN PATENT DOCUMENTS

| | | |
|---|---|---|
| EP | 1287566 B1 | 10/2003 |
| EP | 1976034 A2 | 10/2008 |
| JP | 2013062370 A * | 4/2013 |

OTHER PUBLICATIONS

Teraki, JP2013062370A, Machine Translation (Year: 2013).*

* cited by examiner

*Primary Examiner* — Devina Pillay

(57) ABSTRACT

A thermoelectric element (40), comprising a dielectric substrate (100) having a hole (120), wherein the hole has a first opening on a first side of the dielectric substrate and a second opening on a second side of the dielectric substrate; a first metallisation pad (111) and a second metallisation pad (112) on the first side, wherein the first opening is between the first metallisation pad and the second metallisation pad; a planar thermoelectric layer (101) above the hole, wherein the planar thermoelectric layer has an interface with the first metallisation pad and an interface with the second metallisation pad, wherein both interfaces are in the same plane.

20 Claims, 9 Drawing Sheets

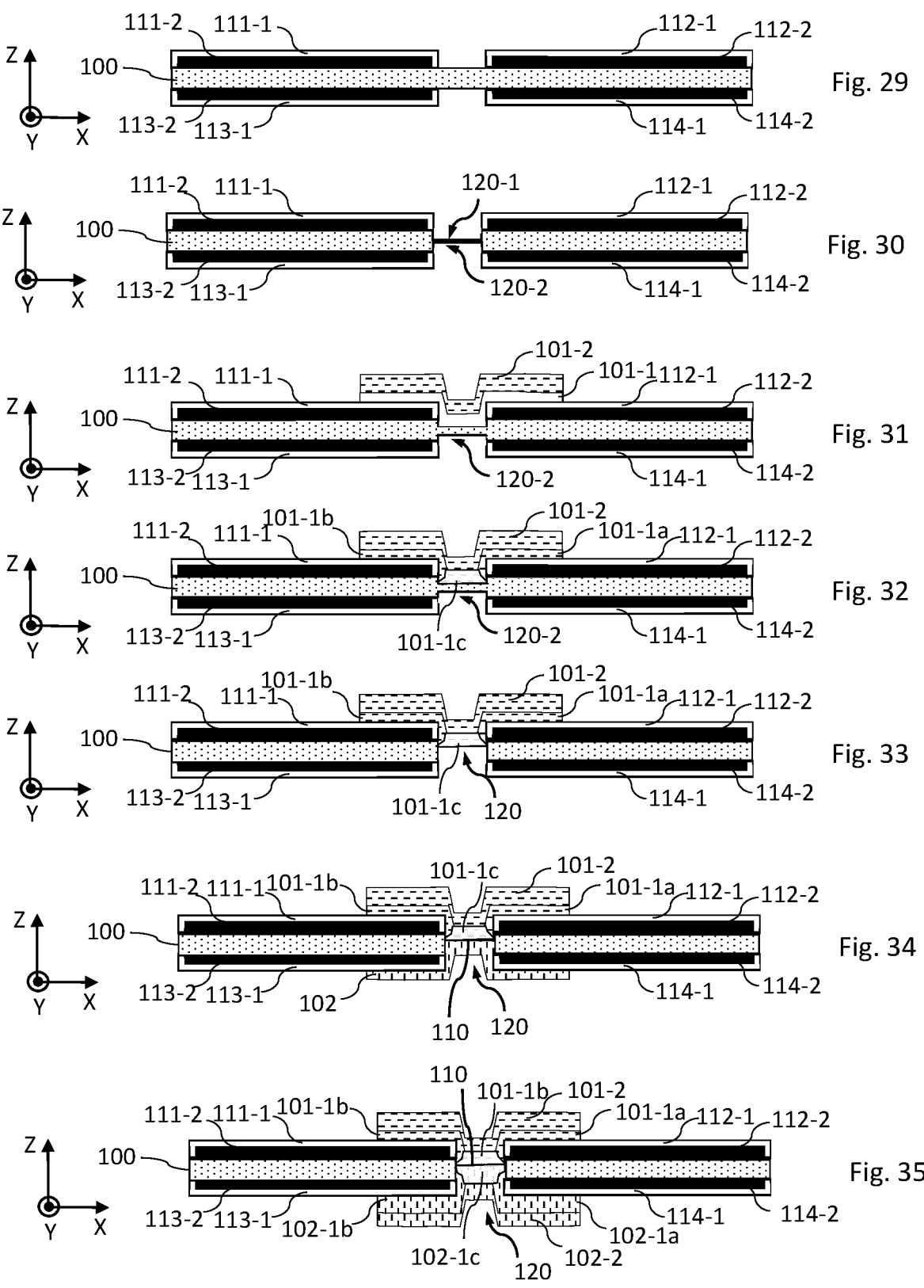

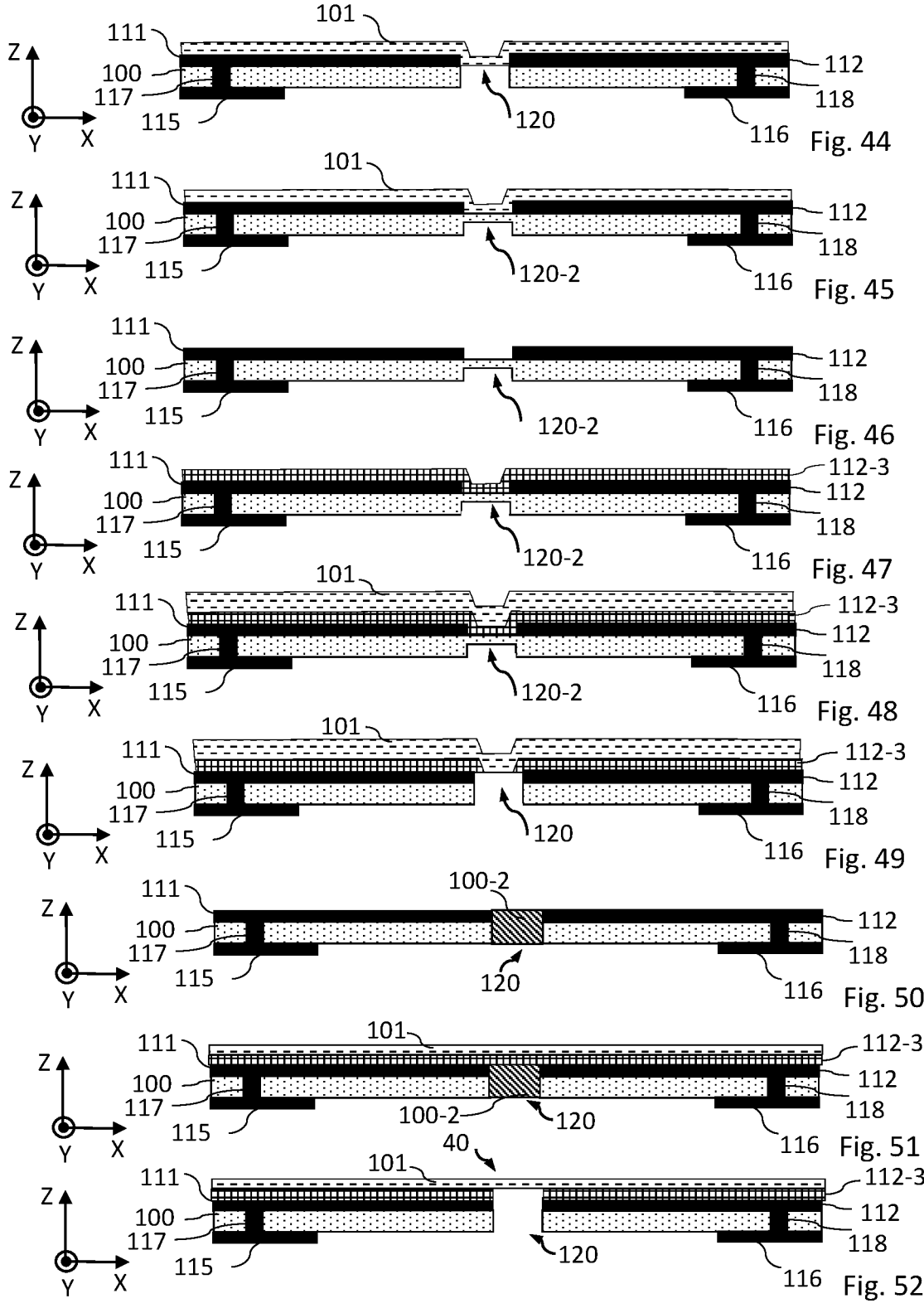

1

THERMOELECTRIC ELEMENT, THERMOELECTRIC GENERATOR, PELTIER ELEMENT, PELTIER COOLER, AND METHODS MANUFACTURING THEREOF

CROSS-REFERENCE TO RELATED APPLICATIONS

This application is a 371 of PCT/EP2022/074397 filed on Sep. 1, 2022, which in turn claims the priority of DE 10 2021 209 656.5 filed on September 2 with the German Patent and Trademark Office, 2021, the priority of both applications is hereby claimed and both applications are incorporated herein by reference.

FIELD OF INVENTION

The present invention refers to thermoelectric elements and Peltier elements. These elements employ single layers of thermoelectric materials or p-n p-i-n junctions. The invention further refers to thermoelectric generators employing the thermoelectric elements, Peltier coolers employing the Peltier elements, and methods for manufacturing of the thermoelectric elements and generators, the Peltier elements and Peltier coolers.

BACKGROUND

A thermoelectric element with a p-n junction is known from EP 1 287 566 B1. In this thermoelectric element a higher efficiency is achieved in comparison with conventional thermoelectric elements. In the thermoelectric element disclosed in EP 1 287 566 B1 the p-n junction is formed essentially over the entire extension of the n and p layer, whereby a temperature gradient is applied along the p-n junction interface. This results in a temperature difference along this elongated p-n junction between two ends of the p-n layer stack. The thermoelectric element is selectively contacted at the n and p layers. This can be done either by alloying the contacts and the associated p-n junctions or by directly contacting the n- and p-layer. To connect several thermoelectric elements to form a generator, they are connected in series by cross-connected lines. Thermally, the individual thermoelectric elements of the generator are connected in parallel.

SUMMARY

Based on this prior art, the technical objective of the invention is to develop a thermoelectric element and a method of manufacturing thereof, wherein the thermoelectric element is manufacturable using industrialised processes in an inexpensive way. The thermoelectric element is suitable for series connection in a thermoelectric generator. The technical objective of the invention is further to develop such a generator and a method of manufacturing thereof. Aspects of the present invention are provided in the independent claims. Embodiments are provided in the dependent claims.

The solution is based on an idea of using a dielectric substrate with a hole. The thermoelectric layers of different conductivity types are arranged on opposite sides of the dielectric substrate and contact each other in the hole thereby building a p-n or p-i-n junction. This arrangement eliminates the need of using of additional dielectric layers as it is customary in the planar process of the semiconductor industry. Moreover, the hole reduces a parasitic heat flow via the substrate as it is customary in thermoelectric elements employing substrates.

Another application of the invention is using the thermoelectric element with a p-n or p-i-n junction as a Peltier cooler or an element of a Peltier cooler employing a series of such elements. In this case a voltage is applied to the p-n or p-i-n junction such that the p-n or p-i-n junction is reverse biased. The same thermoelectric layers as for thermoelectric power generation of electricity can be used in in such a Peltier cooler. In addition, such a Peltier cooler can employ semiconductor layers of different conductivity types, which are not suitable for thermoelectric generation of electricity.

The idea underlaying the invention can be adapted for thermoelectric elements and Peltier cooler elements which employ singe layers of thermoelectric materials. As it will be evident from the detailed description below one of the thermoelectric layers can be omitted in the thermoelectric element. The hole in the dielectric substrate of such a thermoelectric element has the same beneficial effect as in the thermoelectric element employing the p-n p-i-n junction.

BRIEF DESCRIPTION OF THE DRAWINGS

FIGS. 29-35 illustrate steps of methods for manufacturing thermoelectric elements, wherein contours being out of the plane of the cross-sections are omitted merely for illustrative purposes.

FIGS. 44-52 illustrate steps of methods for manufacturing thermoelectric elements, wherein contours being out of the plane of the cross-sections are omitted merely for illustrative purposes.

Axis directions X, Y, Z are the same in all Figures.

DESCRIPTION

Merely for the sake of simplicity, this chapter describes aspects of the invention in the context of thermoelectric elements and generators employing p-n or p-i-n junctions. Further aspects of the invention related to Peltier coolers and thermoelectric elements employing single thermoelectric layers are described in the next chapter.

Figures 1, 2, 3, 4, 5, 6:
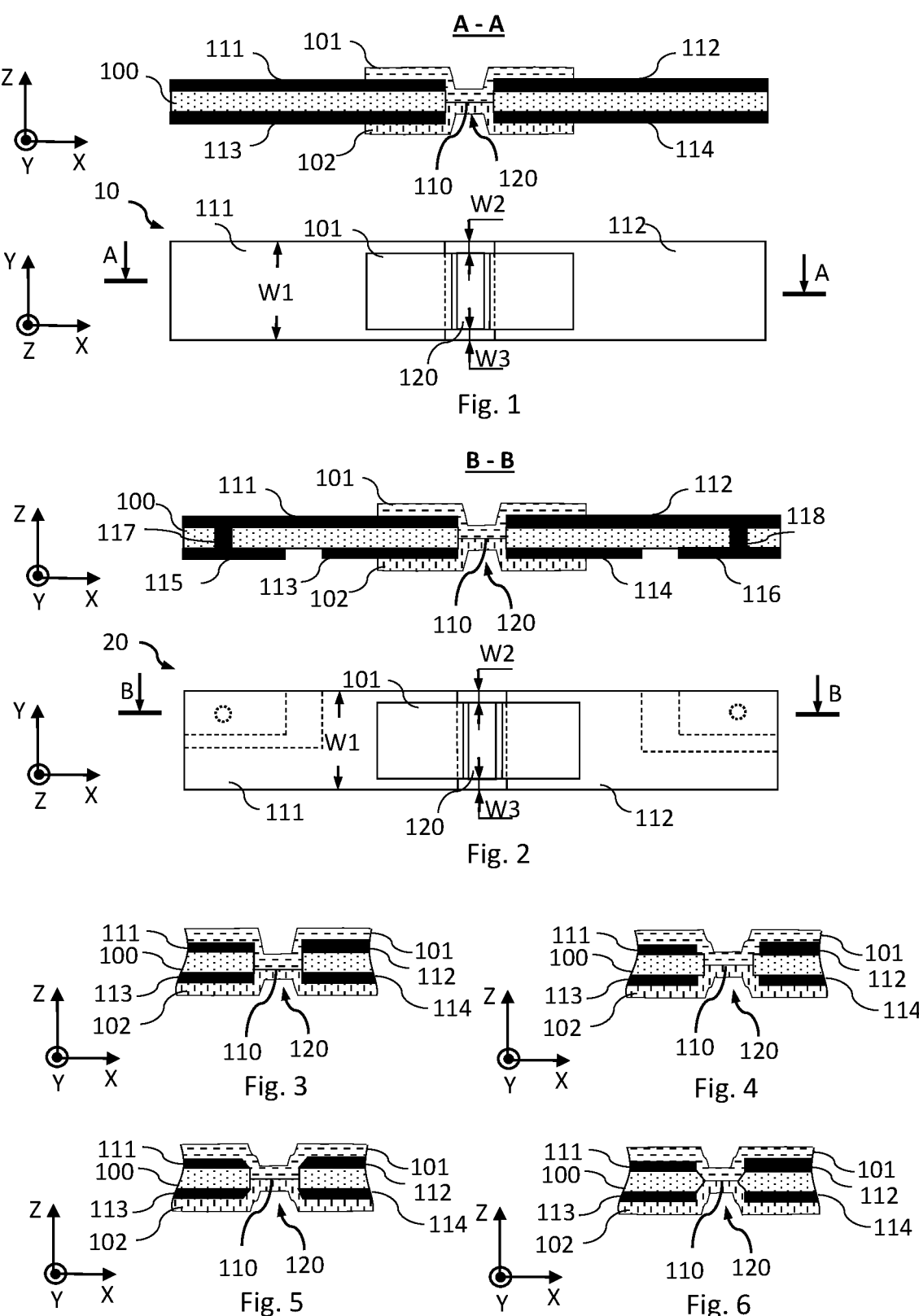
FIG. 1 illustrates a thermoelectric element and its cross-section, wherein contours being out of the plane of the cross-section are omitted merely for illustrative purposes.
FIG. 2 illustrates another thermoelectric element and its cross-section, wherein contours being out of the plane of the cross-section are omitted merely for illustrative purposes.
FIGS. 3-8 illustrate cross-sections of central portions of thermoelectric elements, wherein contours being out of the plane of the cross-sections are omitted merely for illustrative purposes.

Like-numbered elements in FIGS. 1-52 are either equivalent elements or elements that perform the same function. Elements that have been discussed previously will not necessarily be discussed in later figures if the function is equivalent.

FIG. 1 depicts a thermoelectric element 10 and its cross-section. The thermoelectric element comprises a dielectric substrate 100 with metallisation pads 111-114. The dielectric substrate has a hole 120. The hole has a first opening on the first side of the dielectric substrate and a second opening on the second side of the dielectric substrate. A first metallisation pad 111 and a second metallisation pad 112 are on the first side of the dielectric substrate. A third metallisation pad 113 and a fourth metallisation pad 114 are on the second side of the dielectric substrate. The first opening of the hole is between the first metallisation pad 111 and the second metallisation pad 112. The second opening of the hole is between the third metallisation pad 113 and the fourth metallisation pad 114. The thermoelectric element further comprises a first thermoelectric layer 101 on its first side and a second thermoelectric layer 102 on its second side. The first thermoelectric layer 101 is in direct contact with the first metallisation pad 111 and the second metallisation pad 112. The second thermoelectric layer 102 is in direct contact with the third metallisation pad 113 and the fourth metallisation pad 114. The first thermoelectric layer 101 and the second thermoelectric layer 102 have different conductivity types. The first thermoelectric layer may have a p-type conductivity and the second thermoelectric layer may have an n-type conductivity, or the other way around. The first thermoelectric layer 101 and the second thermoelectric layer 102 contact each other in the hole 120 and thereby build a p-n or p-i-n junction. The first metallisation pad 111 faces the third metallisation pad 113 and is separated from it by the dielectric substrate 100. The second metallisation pad 112 faces the fourth metallisation pad 114 and is separated from it by the dielectric substrate 100. The metallisation pads 111-114 would have been galvanically insulated from each other, when the thermoelectric layers 101 and 102 are absent. In other words, the metallisation pads 111 and 112 are galvanically connected to each other via the first thermoelectric layer 101, the metallisation pads 113 and 114 are galvanically connected to each other via the second thermoelectric layer 102, and the metallisation pads (e.g., 111 and 113) on different sides of the dielectric substrate are galvanically connected to each other via the first and the second thermoelectric layers.

The first metallisation pad 111 and the third metallisation pad 113 are arranged for thermal coupling to a heat sink. The second metallisation pad 112 and the fourth metallisation pad 114 are arranged for thermal coupling to a heat source. The thermal coupling can be provided by using portions of the metallisation pads 111-114, wherein these portions are preferably devoid of the thermoelectric layers 101 and 102. In operation, a thermal gradient is applied between a pair of the first metallisation pad 111 and the third metallisation pad 113 and a pair of the second metallisation pad 112 and the fourth metallisation pad 114. The thermal gradient coincides with the direction X in FIG. 1. A voltage generated by the thermoelectric element 10, when in operation, is tapped from the first metallisation pad 111 and the third metallisation pad 113. Utilisation of the metallisation pads on the dielectric substrate thermal couplings and electrical connections may provide an advantage over the thermoelectric generators employing massive blocks made of thermoelectric materials. Such a solution requires that electrical connections to these massive blocks are optimised for both bonding strength and electrical resistivity. In contrast, bonding strength between the thermoelectric layers and the metallisation pads in the thermoelectric elements described herein is less critical because the mechanical stability of the thermoelectric elements determined not only by the thermoelectric layers and their bonding strength to the metallisation pads but also by the substrate and a bonding strength of the metallisation pads to the substrate.

A shape of the hole 120 is arranged such that a parasitic heat flow is substantially reduced in comparison with conventional thermoelectric elements employing substrates. In contrast to conventional thermoelectric elements, wherein a parasitic heat flow flows via entire cross-section of a substrate, the parasitic heat flow flows only via portions of the dielectric substrate 100 not terminated by the hole 120 in the direction of the thermal gradient. This can be achieved by arranging a dimension of the hole in Y direction being at least 70%, preferably at least 80% of a dimension of the dielectric substrate 100 in the same direction. Y direction is orthogonal to the thermal gradient and within a plane defined by the first side of the dielectric substrate 100. The portions of the dielectric substrate providing the parasitic heat flow have widths W2 and W3 in Y direction. The sum of these widths is smaller than a width W1 of the dielectric substrate in Y direction. Preferably the sum of the widths W2 and W3 is less than 30%, more preferably less than 20%, of W1.

In addition, the thermoelectric element may have at least one additional metallisation pad which is placed on an opposite side of the dielectric substrate with respect to one of the metallisation pads 111-114 and thermally and galvanically connected to the one of the metallisation pads 111-114. In the example depicted in FIG. 2, the thermoelectric element 20 has a fifth metallisation pad 115 and a sixth metallisation pad 116 on the second side of the dielectric substrate 100. The fifth metallisation pad 115 faces the first metallisation pad 111 and is separated from it by the dielectric substrate 100. The fifth metallisation pad 115 is thermally and electrically connected to the first metallisation pad 111 via a metal via 117. The sixth metallisation pad 116 faces the second metallisation pad 112 and is separated from it by the dielectric substrate 100. The sixth metallisation pad 116 is thermally and electrically connected to the second metallisation pad 112 via a metal via 118. Utilisation of such additional metallisation pads may enable implementation of thermal couplings and/or electrical connections only from one side of the dielectric substrate 100. The fifth and sixth metallisation pads each have a portion devoid of the second thermoelectric layer, wherein these portions are arranged for thermal couplings and/or electrical connections. This is further elaborated in context of thermoelectric generators described below.

Materials of the thermoelectric layers 101 and 102 may have different electrical and/or thermal conductivities. This disparity may be compensated by using thermoelectric layers of different thickness and/or positioning the interface between the thermoelectric layers 101 and 102 closer to one side of the dielectric substrate than to the other one. The thermoelectric layer made of a material having lower electrical and/or thermal conductivity may be made thicker than the other one. In addition or as alternative, an interface 110 between the thermoelectric layers 101 and 102 may be made closer to the substrate side, on which the thermoelectric layer made of material having lower thermal and/or electrical conductivity is placed. Another optional measure for addressing this issue is drive-in of dopants from the metallisation pad or its coating into a fragment of the thermoelectric layer adjacent to the metallisation pad (e.g., as depicted in FIGS. 33 and 35). As a result of this a fragment of the thermoelectric layer between the p-n or p-i-n junction and the metallisation pad has an increased thermal and/or electrical conductivity. The drive-in of dopants is described in greater detail further in the text.

In an example depicted in FIG. 3 it is assumed, that the second thermoelectric layer 102 is made of a material having lower thermal and/or electrical conductivity than a material of the first thermoelectric layer 101. The interface 110 is positioned closer to the second side than to the first side of the dielectric substrate 100. As a result, a heat conduction path via the second thermoelectric layer 102 from the fourth metallisation pad 114 to the third metallisation pad 113 is shorter than a heat conduction path via the first thermoelectric layer from the second metallisation pad 112 to the first metallisation pad 111. In addition, an electrical conduction path via the second thermoelectric layer 102 from the interface 110 to the third metallisation pad 113 is shorter than an electrical conduction path via the first thermoelectric layer 101 from the interface 110 to the first metallisation pad 111.

Some methods (e.g., sputtering) employed for deposition of the thermoelectric layers 101 and 102 may encounter step coverage problems, wherein a thickness of a material deposited on a substantially vertical sidewall is lower than a thickness of a material deposited on a substantially horizontal substrate surface. In the specific case of the thermoelectric elements depicted in FIGS. 1 and 2 vertical sidewalls of the metallisation pads 111-114 and the hole 120 may result in a reduced thickness of the thermoelectric layers 101 and 102 on these vertical sidewalls. As a result, a thermal and/or electrical conductivity of portions of the thermoelectric layers 101 and 102 connecting the metallisation pads 111-114 with the p-n or p-i-n junction may be reduced. This problem may be addressed by the drive-in of dopants as described herein. The drive-in of dopants from the metallisation pad or its coating may increase the thermal and/or electrical conductivity of a portion of the thermoelectric layer 101 or 102 connecting the metallisation pad 111-114 with the p-n or p-i-n junction.

This problem may also be addressed by employing metallisation pads with tapered sidewalls and/or by tapering sidewalls of the hole 120. Metallisation pads on one side of the dielectric substrate (e.g., 111 and 112, or 113 and 114) have respective sidewalls facing each other and separated by the hole opening. At least one of these sidewalls may be tapered such that a distance between these sidewalls in a plane parallel to the substrate surface increases in a direction away from the substrate surface. Sidewalls of the hole can be tapered such that a neck in a plane of the interface 110 between the thermoelectric layers 101 and 102 is built. In other words, the hole is tapered outwards in both directions from the interface as a distance from the interface increases. As alternative the hole may be tapered outwards only one direction from the interface and have vertical sidewalls in another direction from the interface. A tapering angle of the sidewalls of the metallisation pads 111-114 and the hole 120 may be at least 30 degrees. The tapering angle is defined as an angle between a sidewall and a vertical direction Z being orthogonal to the substrate surface. In addition or as alternative, as least one of the metallisation pads may be placed at a distance from the respective hole opening. This distance may be in a range of 40% to 80% of a thickness of the metallisation pad.

In a more rigorous form the distance between the hole opening and the metallisation pad may be specified as follows. A pair of metallisation pads on one side of the dielectric substrate 100 have sidewalls facing each other and separated by the hole opening on this side. Since the side wall may be tapered, its contour is selected in a plane of the substrate surface. The hole opening has a fragment of its contour closely following the contour of the side wall. The term "closely following" may be substituted by the term "congruent to" when absolute mathematical rigor is required. The distance between the sidewall and the opening is defined as a distance between the contour of the sidewall and the fragment of the contour of the hole opening.

An improved step coverage of the sidewalls of the hole and/or metallisation pads by the thermoelectric layers is schematically depicted in FIGS. 4-6. An example of metallisation pads 111-114 spaced from the hole openings is depicted in FIG. 4. As can be seen from comparison of FIGS. 1 and 4 portions of the thermoelectric layers 101 and 102 on the sidewalls of the metallisation pads 111-114 and the hole 120 are thicker in FIG. 4. An example of metallisation pads 111-114 having tapered sidewalls is depicted in FIG. 5. As can be seen from comparison of FIGS. 1 and 5 portions of the thermoelectric layers on the tapered sidewalls of the metallisation pads are thicker than the respective portions of the thermoelectric layers on the vertical sidewalls of the metallisation pads. An example of tapering of the sidewalls of the hole 120 is depicted in FIG. 6. As can be seen from comparison of FIGS. 1 and 6 tapering of the hole sidewalls results in thicker thermoelectric layers thereon.

The measures such as shifting the interface 110 towards one of the sides of the dielectric substrate, placing the metallisation pads spaced from the respective hole openings, tapering of the sidewalls of the metallisation pads, and tapering of the hole sidewalls can be combined in any arbitrary way on condition that none of the metallisation pads 111-114 in direct contact with both thermoelectric layers 101 and 102.

Bi2Te3-based thermoelectric materials (e.g., n-type Cu0.01Bi2Te2.7Se0.35 or Bi2Te2.7Se0.3; p-type BixSb2-xTe3), metallisation pads (e.g., structured copper layers coated (e.g. plated) by nickel or cobalt), and plastic dielectric substrates such as prepreg can be used in thermoelectric elements operating in a temperature range below 250 degrees Celsius, preferably below 200 degrees Celsius. Preferred coatings of metallisation pads for Bi2Te3-based thermoelectric materials of n-type are (Bi2Te2.7Se0.3)0.99 (SbI3)0.01, NiSe2, Co, NiFeInS, Sb, Fe0.85Cr0.15, TiN or Ti. Preferred coating for metallisation pads for Bi2Te3-based thermoelectric materials of p-type is Ni, however the preferred coatings for Bi2Te3-based thermoelectric materials of n-type are also usable for p-type. CoSb3-based skutterudite thermoelectric materials (e.g.: n-type Ba0.08La0.05Yb0.04Co4Sb12, skutterudite p-type Ce0.45Nd0.45Fe3.5Co0.5Sb12), cold side metallisation pads (e.g., structured copper layers coated by Ti, Ga—Sn alloy, Ag—Cu—Zn alloy, or Mo Mo, Cr—Fe—Co alloy or Cr—Fe—Ni alloy), hot side metallisation pads (e.g., structured Mo layers or structured Mo—Cu alloy or Co—Si alloy layers coated by Ti, Ga—Sn alloy, Ag—Cu—Zn alloy, Mo, Cr—Fe—Co alloy or Cr—Fe—Ni alloy), and alumina or silica dielectric substrates can be used in thermoelectric elements operating in a temperature range from 20 to 700 degrees Celsius, preferably from 70 to 550 degrees Celsius. Half-Heusler (HH) alloy-based thermoelectric materials (e.g. n-type XIVNiSn; p-type XIVCoSb, XVFeSb, ZrCoBi, where XIV one or more of Ti, Zr, or Hf, and XV one or more V, Nb, Ta), cold side metallisation pads (e.g., structured copper layers coated by Mo), hot side metallisation pads (e.g., structured Mo or Mo—Fe alloy layers or structured Mo—Cu alloy or Co—Si alloy layers coated by Mo or Ti), and alumina or silica dielectric substrates can be used in thermoelectric elements operating in a temperature range from 200 to 1000 degrees Celsius, preferably from 300 to 900 degrees Celsius. SiGe-based thermoelectric materials, metallisation pads (e.g. structured layers of molybdenum or tungsten metallisation pads coated as an option by graphite), and alumina or silica dielectric substrates can be used in thermoelectric elements operating in a temperature range above 600 degrees Celsius, preferably above 750 degrees Celsius.

Figures 7, 8, 9, 10, 11, 12:
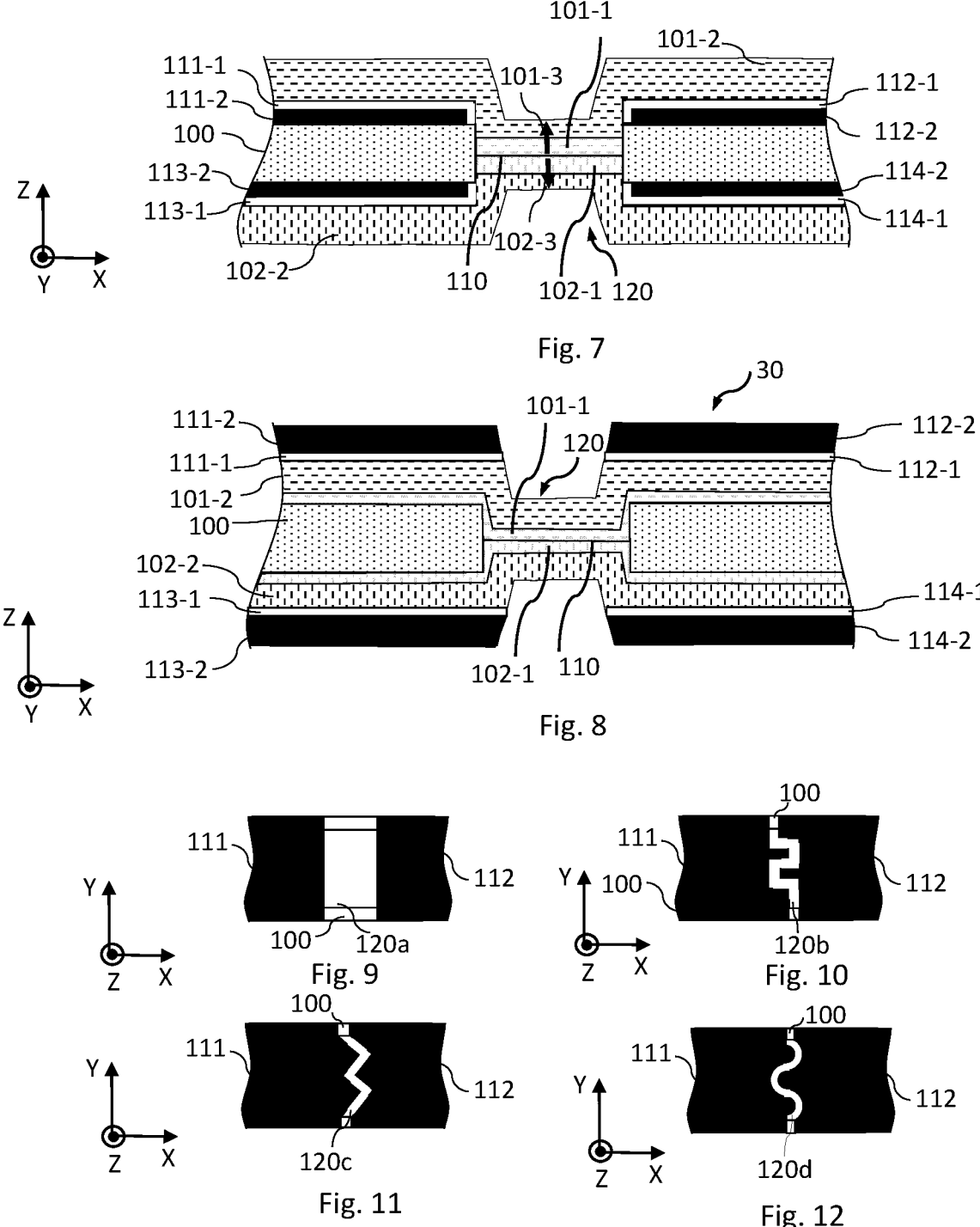
FIGS. 9-12 illustrate central portions of dielectric substrates with metallisation pads.

These composite metallisation pads are illustrated in FIG. 7 depicting a cross-section of the central portion the thermoelectric elements depicted in FIGS. 1 and 2. The metallisation pads 111-114 in FIGS. 1 and 2 correspond to respective metallisation pads each comprising a pair of layers 111-1 and 111-2, 112-1 and 112-2, 113-1 and 113-2, 114-1 and 114-2. The structured layers mentioned above are depicted as structured layers 111-2, 112-2, 113-2, and 114-2, whereas their coatings are depicted as coatings 111-1, 112-1, 113-1, and 114-1. Thickness of the structured layer 111-2, 112-2, 113-2, or 114-2 is at least 1 µm, preferably at least 10 µm. The thickness of the structured layer 111-2, 112-2, 113-2, or 114-2 is selected such, that it provides good heat transfer from or to the portions of the thermoelectric layers 101 and/or 102 positioned in the hole 120. In other words, the heat conduction of the metallisation pads 111-114 must be at least 10 times higher than said portions of the thermoelectric layers 101 and 102 in the hole 120. Thickness of the coating 111-1, 112-1, 113-1, or 114-1 is at least 10 nm, preferably at least 100 nm.

The composition of the metallisation pad 111, 112, 113, or 114 is not limited to one or two layers as mentioned above. For instance, the coating 111-1, 112-1, 113-1, or 114-1 may have several functionalities and each functionality may be provided by a one or more layers of the coating. One layer of the coating 111-1, 112-1, 113-1, or 114-1 may act as diffusion barrier (e.g. TiN), which prevents diffusion of the atoms of the underlaying layers of the metallisation pad 111-114 into the adjacent thermoelectric layer 101 or 102 and/or diffusion of atoms of the thermoelectric layer 101 or 102 into the metallisation pad 111-114. Another layer of the coating 111-1, 112-1, 113-1, or 114-1 may on contrary function as a source of dopants for the adjacent thermoelectric layer 101 or 102. Yet another layer of the coating 111-1, 112-1, 113-1, or 114-1 may promote alloying between the metallisation pad 111-114 and the adjacent thermoelectric layer 101 or 102, e.g. brazing alloys for alloying HH alloy-based thermoelectric layer with the metallisation pad. Yet another layer of the coating 111-1, 112-1, 113-1, or 114-1 may work as work function setting material for electrical contact between the metallisation pad and the thermoelectric layer (e.g. Mo or Ti work function material for p-type HH alloy based thermoelectric layer). The latter functionality is of particular importance for Peltier cooling applications. Its implementation for Bi2Te3-based thermoelectric materials will be discussed later in the next chapter. The choice of specific stack of layers in the coating 111-1, 112-1, 113-1, or 114-1 depends on a thermoelectric layer material, an operational temperature of a thermoelectric element, and an application type (generation of electricity or Peltier cooling). Yet another functionality of the coatings 111-1, 112-1, 113-1, 114-1 can be a reduction of thermal contact resistance between the thermoelectric layer and the metallisation pad. The thermal contact resistance can originate from a Kapitza resistance, which may be mitigated by so-called phonon bridge layer having a spectral density of states that eases the transfer of phonons from one side of the interface to the other.

At least one of the thermoelectric layers 101 or 102 can have as an option a doping level gradient, wherein a fragment of the thermoelectric layer 101, which is adjacent to the interface 110 and builds n- or p-portion of the p-n junction or n-i or p-i portion of the p-i-n junction, can have a dopant concentration gradient in positive Z direction, i.e. a concentration of dopants increases in a direction marked by the arrow 101-3, whereas a fragment of the thermoelectric layer 102, which is adjacent to the interface 110 and builds a p- or n-portion of the p-n junction or p-i or n-i portion of the p-i-n junction, respectively, can have a dopant concentration gradient in negative Z direction, i.e. a concentration of dopants increases in a direction marked by the arrow 102-3 (FIG. 7). Such thermoelectric layers can be manufactured by chemical vapor deposition (CVD) of a SiGe-based thermoelectric layer, wherein dopant precursors like phosphine or diborane are tuned during the deposition process such that the dopant concentration increases throughout the layer growth.

A layer-wise approach can be used for a broader spectrum of materials including SiGe-based thermoelectric materials, Bi2Te3-based thermoelectric materials, CoSb3-based skutterudite thermoelectric materials, and HH-alloy based thermoelectric materials. The first thermoelectric layer 101 may have a remote portion 101-2 and an interface portion 101-1 adjacent to the interface 110, wherein the interface portion 101-1 is between the interface 110 and the remote portion 101-2 and the metallisation pads 111 and 112 are in direct contact with the remote portion 101-2. The interface portion 101-1 has a lower average concentration of dopants than the remote portion 101-2 in case of SiGe-based thermoelectric layers, wherein the average concentrations of dopants are averaged over the volumes of the respective portions. The same can apply as option for the second thermoelectric layer 102. It may have a remote portion 102-2 and an interface portion 102-1 adjacent to the interface 110, wherein the interface portion 102-1 is between the interface 110 and the remote portion 102-2 and the metallisation pads 113 and 114 are in direct contact with the remote portion 102-2. The interface portion 102-1 has a lower average concentration of dopants than the remote portion in case of SiGe-based thermoelectric layers. The dopant concentration formalism may be quite difficult to apply for the other thermoelectric materials because their properties are tuned not only by adding dopant atoms but by changing their chemical compositions. Moreover, doping efficiency of dopants is quite low in these materials. In contrast to Si crystals having a few dopant atoms per million of Si atoms these materials have 1 dopant atom per 1000 or even 100 atoms of the material. In this respect it may be more practical to characterise thermoelectric layers and their portions by bulk properties of materials used for their manufacturing. The bulk properties of a specific material comprise its chemical composition and charge carrier concentration, which can be measured from Hall effect. Such an approach is more universal since it is applicable for a broad spectrum of thermoelectric materials including the aforementioned ones. Based on this approach the thermoelectric layer 101 can be characterised as follows. The interface portion 101-1 is made of a thermoelectric material having a lower charge carrier concentration than a thermoelectric material used for the remote portion 101-2. Preferably the remote portion 101-2 has a thickness in a range of 1-30% of the thickness of the thermoelectric layer 101. Preferably these materials have affinity to each other, i.e. they belong to the same group of materials, e.g. to Bi2Te3-based thermoelectric materials or CoSb3-based skutterudite thermoelectric materials, and have the same crystal structure and conductivity type and similar chemical composition, preferably they have not more than two differing chemical elements, e.g. the interface portion 101-1 is made of Bi2Te3, whereas the remote portion 101-2 is made of Bi2Te2.7Se0.3. The thermoelectric layer 102 may also have an interface portion 102-1 and a remote portion 102-2. The interface portion 102-1 is between the interface 110 and the remote portion 102-2 and the metallisation pads 113 and 114 are in direct contact with the remote portion 101-2. The interface portion 102-1 is made of a thermoelectric material having a lower charge carrier concentration than a thermoelectric material used for the remote portion 102-2. Preferably the remote portion 102-2 has a thickness in a range of 1-30% of the thickness of the thermoelectric layer 102. Preferably these materials have affinity to each other, i.e. they belong to the same group of materials and have the same crystal structure and conductivity type and similar chemical composition, preferably they have not more than two differing chemical elements.

The layer-based approach is not limited to two layers or portions per thermoelectric layer. Any one or each of the first 101 and the second 102 thermoelectric layer can comprise any number of stacked portions or layers, wherein the layer or portion being the first in the stack is adjacent to the interface 110, the layer or portion being the last in the stack is adjacent to the first 111 and the second 112 metallisation pad or the third 113 and the fourth 114 metallisation pad, respectively, and each next layer or portion in the stack has higher average dopant concentration than a layer or portion in the stack being immediately before the each next layer or portion and/or a material of the each next layer has higher charge carrier concentration than a material of the layer or portion in the stack being immediately before the each next layer or portion.

FIG. 8 illustrates a cross-section of an alternative implementation 30 of the thermoelectric elements depicted in FIGS. 1 and 2. The cross-section depicted in FIG. 8 has a different sequence of layers. In FIGS. 1-7 the metallisation pads 111 and 112 are between the first thermoelectric layer 101 and the substrate 100 and the metallisation pads 113 and 114 are between the second thermoelectric layer 102 and the substrate 100. In contrast, the first thermoelectric layer 101 depicted as layers or portions 101-1 and 101-2 in FIG. 8 is on the first side of the dielectric substrate 100 between the dielectric substrate 100 and the metallisation pads 111 and 112 depicted, respectively, as a pair of layers 111-1 and 111-2 and a pair of layers 112-1 and 112-2, and the second thermoelectric layer 102 depicted as layers or portions 102-1 and 102-2 in FIG. 8 is on the second side of the dielectric substrate 100 between the dielectric substrate 100 and the metallisation pads 113 and 114 depicted, respectively, as a pair of layers 113-1 and 113-2 and a pair of layers 114-1 and 114-2, wherein the first and the second sides are opposite sides of the substrate 100. The thermoelectric layers 101 and 102 contact with each other via a hole 120 in the substrate 100 and thereby build a p-n or p-i-n junction. The metallisation pads 111 and 112 are in direct contact with the first thermoelectric layer 101 and the metallisation pads 113 and 114 are in direct contact with the second thermoelectric layer 102.

Referring further to FIG. 8, the metallisation pads 111 and 112 are separated by a portion of the first thermoelectric layer 101 building the p-n or p-i-n junction, i.e. the portion being in contact with the second thermoelectric layer 102. The positioning of the metallisation pads 111 and 112 may be determined using mathematical rigor as follows. A first opening of the hole 120 on the first side of the substrate projected in X-Y plane and/or the interface 120 of the p-n or p-i-n junction projected in X-Y plane are at least partially between projections of the metallisation pads 111 and 112 in X-Y plane. The metallisation pads 113 and 114 are separated by a portion of the second thermoelectric layer 102 building the p-n or p-i-n junction, i.e. the portion being in contact with the first thermoelectric layer 102. The positioning of the metallisation pads 113 and 114 may be determined using mathematical rigor as follows. A second opening of the hole 120 on the second side of the substrate projected in X-Y plane and/or the interface 120 of the p-n or p-i-n junction projected in X-Y plane are at least partially between projections of the metallisation pads 113 and 114 in X-Y plane. Any of metallisation pads 111-114 is electrically connected to any other of metallisation pads 111-114 only via one or both of thermoelectric layers 101 and 102.

The distal ends of the metallisation pads 111-114 depicted in FIG. 8 may extend to the respective ends of the substrate in positive and negative X directions, respectively, as depicted in FIG. 1. In other words, the metallisation pads 111-114 of the thermoelectric element depicted in FIG. 8 may be structured in X-Y plane in substantially similar way as the metallisation pads 111-114 of the thermoelectric element depicted in FIG. 1. In case the configuration of the metallisation pads includes the metallisation pad 115, the metallisation pad 116, the metal via 115 connecting the metallisation pads 111 and 115 separated by the substrate 100, and the metal via connecting metallisation pads 112 and 116 separated by the substrate 100, as depicted in FIG. 2, the thermoelectric layer 102 depicted in FIG. 8 is structured in X-Y plane in a similar way as the thermoelectric layer depicted in FIG. 2. The distal ends of the thermoelectric layer 102 depicted in FIG. 8 extending in positive and negative X directions from the hole 120, respectively, do not reach the metallisation pads 115 and 116, or in other words none of the metallisation pads 115 and 116 is direct contact with the thermoelectric layer 102. Distal ends of the thermoelectric layer 101 extending in positive and negative X directions from the hole 120, respectively, may extend to the respective ends of the substrate 100. In this case, the metal vias 115 and 116 extend through the thermoelectric layer 101 and the substrate 100. Alternatively, the thermoelectric layer 101 depicted in FIG. 8 may be structured in a similar way as depicted in FIG. 2. In this case, the metal vias 115 and 116 extend through the substrate 100 as depicted in FIG. 2.

The thermoelectric layer 101 depicted in FIG. 8 may have the same patterning and/or composition like doping level gradient as thermoelectric layer 101 in other embodiments described herein, and the thermoelectric layer 102 depicted in FIG. 8 may have the same patterning and/or composition like doping level gradient as thermoelectric layer 102 in other embodiments described herein. In particular a fragment of the thermoelectric layer 101 depicted in FIG. 8, which is adjacent to the interface 110 and builds n- or p-portion of the p-n or n-i or p-i portion of the p-i-n junction, can have as an option a dopant concentration gradient in positive Z direction, whereas a fragment of the thermoelectric layer 102, which is adjacent to the interface 110 and builds p- or n-portion of the p-n junction or p-i or n-i portion of the p-i-n junction, respectively can have as an option a dopant concentration gradient in negative Z direction.

Alternatively, the first thermoelectric layer 101 in FIG. 8 may have a remote portion illustrated as a remote layer 101-2 and an interface portion illustrated as an interface layer 101-1 adjacent to the interface 110 and the first side of the substrate, wherein a fragment of the interface layer 101-1 is between the interface 110 and the remote layer 101-2. Preferably the remote layer 101-2 has a thickness in a range of 1-15% of the thickness of the thermoelectric layer 101. The second thermoelectric layer 102 in FIG. 8 may have a remote portion illustrated as a remote layer 102-2 and an interface portion illustrated as an interface layer 102-1 adjacent to the interface 110 and the second side of the substrate, wherein a fragment of the interface layer 102-1 is between the interface 110 and the remote layer 102-2. Preferably the remote layer 102-2 has a thickness in a range of 1-15% of the thickness of the thermoelectric layer 102. The interface layers 101-1 and 102-1 can have the same material properties as the interface portions 101-1 and 102-1 depicted in FIG. 7, respectively. The remote layers 101-2 and 102-2 can have the same material properties as the remote portions 101-2 and 102-2 depicted in FIG. 7.

In analogous way as mentioned above the layer-based approach is not limited to two layers or portions per thermoelectric layer for the thermoelectric element depicted in FIG. 8. Any one or each of the first 101 and the second 102 thermoelectric layer can comprise any number of stacked portions or layers, wherein the layer or portion being the first in the stack is adjacent to the interface 110, the layer or portion being the last in the stack is adjacent to the first 111 and the second 112 metallisation pad or the third 113 and the fourth 114 metallisation pad, respectively, and each next layer or portion in the stack has higher average dopant concentration than a layer or portion in the stack being immediately before the each next layer or portion and/or a material of the each next layer has higher charge carrier concentration than a material of the layer or portion in the stack being immediately before the each next layer or portion.

Referring further to FIG. 8, at least one of metallisation pads 111-114 comprises as an option a respective interface metallisation layer 111-1, 112-1, 113-1, or 114-1 and a respective bulk metallisation layer 111-2, 112-2, 113-2, or 114-2. The interface metallisation layer 111-1, 112-1, 113-1, or 114-1 has at least one of the following functionalities: providing a low resistivity and/or an ohmic contact between the bulk metallisation layer 111-2, 112-2, 113-2, or 114-2 and the thermoelectric layer 101 or 102, alloying with the thermoelectric layer 101 or 102 and/or the bulk metallisation layer 111-2, 112-2, 113-2, or 114-2, being a work function setting material for electrical contact between the metallisation pad 111, 112, 113, or 114 and the thermoelectric layer 101 or 102, being a diffusion barrier for preventing diffusion of a atoms of the bulk metallisation layer 111-2, 112-2, 113-2, or 114-2 into the thermoelectric layer 101 or 102 and/or atoms of the thermoelectric layer 101 or 102 into the bulk metallisation layer 111-2, 112-2, 113-2, 114-2. The examples of materials used for implementing these functionalities and preferred thickness of the interface metallisation layers 111-1, 112-1, 113-1, or 114-1 can be the same as specified above for the coatings of the structured layers of the metallisation pads, e.g. coatings 111-1, 112-1, 113-1, 114-1 depicted in FIG. 7. The bulk metallisation layers 111-2, 112-2, 113-2, 114-2 are used primarily for heat transport from or to fragments of the thermoelectric layers 101 and 102 positioned in the hole 120. The examples of materials used for implementing the bulk metallisation layers 111-2, 112-2, 113-2, 114-2 and the preferred thickness of these bulk metallisation layers can be the same as specified above for the structured layers of the metallisation pads, e.g. structured layers 111-1, 112-1, 113-1, or 114-1 depicted in FIG. 7. The metallisation pads 111-114 of the thermoelectric element depicted in FIG. 8 may have further coatings on their outer surfaces for facilitating soldering or brazing of the metallisation pads when assembling a thermoelectric generator using the thermoelectric elements as depicted in FIG. 8. In addition or as alternative the further coatings may serve a purpose of preventing oxidation of the metallisation pads. For instance, copper bulk metallisation layers 111-2, 112-2, 113-2, 114-2 can be plated by nickel or cobalt to prevent oxidation of copper.

The hole 120 can be a slit having various shapes such as a rectangular slit, a meander-shaped slit, a sawtooth-shaped slit (triangular tooth-shaped slit), or a wave-shaped slit (e.g., a sinusoidal or cycloidal wave-shaped slit). The last three arrangements of the slit provide for an unfolded length of a slit being bigger than the width W1 of the dielectric substrate (FIGS. 1 and 2). This may be of advantage, when an internal electrical resistance of the thermoelectric element must be reduced. The slit of any of these shapes may have tapered sidewalls is described above. In addition, the slit of any of these shapes is compatible with arrangements of the metallisation pads described above. Regardless of a specific shape of the slit it is preferred, that it has a constant width throughout its length. This criterion may be formulated in a more rigorous way. Portions of the sidewalls of the slit being adjacent to the respective metallisation pads and positioned on side with respect to the plane of the interface 110 are congruent.

FIGS. 9-12 depict example arrangements of the hole 120. In particular, FIGS. 9-12 illustrate central fragments of the dielectric substrate 100 with metallisation pads coloured black, wherein the thermoelectric layers are omitted merely for illustrative purposes. FIG. 9 illustrates the hole 120a having a shape of the rectangular slit. FIG. 10 illustrates the hole 120b having a shape of the meander-shaped slit. FIG. 11 illustrates the hole 120c having a shape of the sawtooth-shaped slit. FIG. 12 illustrates the hole 120d having a shape of wave-shaped slit.

The thermoelectric elements described herein can be arranged electrically in series in a thermoelectric generator such that a series of p-n or p-i-n junctions is built, wherein the thermoelectric layers of different conductivity types are alternated in the series of p-n or p-i-n junctions. As a result, a voltage generated by the series of p-n or p-i-n junctions is a sum of voltages generated by the individual thermoelectric elements. The serial electrical connection of the thermoelectric elements can be implemented using metallisation pads arranged for thermal coupling to a heat sink. For instance, the first and the third metallisation pads 111 and 113 of the thermoelectric elements 10 can be electrically connected in series, such that an alternating series of the first and the second thermoelectric layers is built. The electrical connection of any thermoelectric element except the first and the last ones in series is defined as follows: a thermoelectric element has a first metallisation pad electrically connected to a third metallisation pad of another thermoelectric element being in series immediately after said thermoelectric element, and a third metallisation pad electrically connected to a first metallisation pad of yet another thermoelectric element being in series immediately before said thermoelectric element, wherein the electrical connections between the first and the third metallisation pads of the adjacent in series thermoelectric elements is implemented using only metallic conductors. A voltage generated by the thermoelectric generator in operation can be tapped from a third metallisation pad 113 of the thermoelectric element being the first one in series and a first metallisation pad of the thermoelectric element being the last one in series. This thermoelectric generator is manufactured by electrically connecting the first metallisation pads with the third metallisation pads of the thermoelectric elements such that an alternating series of the first and the second thermoelectric layers is built.

When the thermoelectric elements 20 comprising the fifth metallisation pad 115 are used in the thermoelectric generator, the fifth metallisation pad 115 can be used instead of the first metallisation pad 111 for serial connection of the thermoelectric elements 20. The electrical connection of any thermoelectric element except the first and the last ones in series is defined as follows: a thermoelectric element has a fifth metallisation pad electrically connected to a third metallisation pad of another thermoelectric element being in series immediately after said thermoelectric element, and a third metallisation pad electrically connected to a fifth metallisation pad of yet another thermoelectric element being in series immediately before said thermoelectric element, wherein the electrical connection between the fifth and the third metallisation pads of the adjacent in series thermoelectric elements is implemented using only metallic conductors. A voltage generated by the thermoelectric generator employing thermoelectric elements 20 can be tapped from a third metallisation pad of a thermoelectric element being the first in the series and a fifth or a first metallisation pad of a thermoelectric element being the last in the series. Utilisation of the thermoelectric elements comprising the fifth metallisation pads may be of advantage, because the electrical connections are implemented on only one side (i.e., the second side) of the dielectric substrates 100 of the thermoelectric elements.

The electrical connections can be implemented/manufactured by soldering or brazing of the metallisation pads together or to interconnect elements. An interconnect element can be a metal wire, a metal bar, a metal stripe, or a combination thereof. The interconnect element may be or further comprise a dielectric substrate with a least one metallisation pad. The interconnect elements may be made of the same materials as used in the thermoelectric elements. Utilisation of the same materials in the interconnect elements and the thermoelectric elements may be of advantage, because these elements exhibit substantially similar expansion at elevated temperature, when the thermoelectric generator is in operation. The interconnect elements may provide electrical connections between the metallisation pads of the thermoelectric elements. The interconnect elements may be adapted for thermal coupling of the thermoelectric elements to a heat source or a heat sink. The interconnect elements may be further adapted for affixing together the thermoelectric elements.

Figures 13, 14:
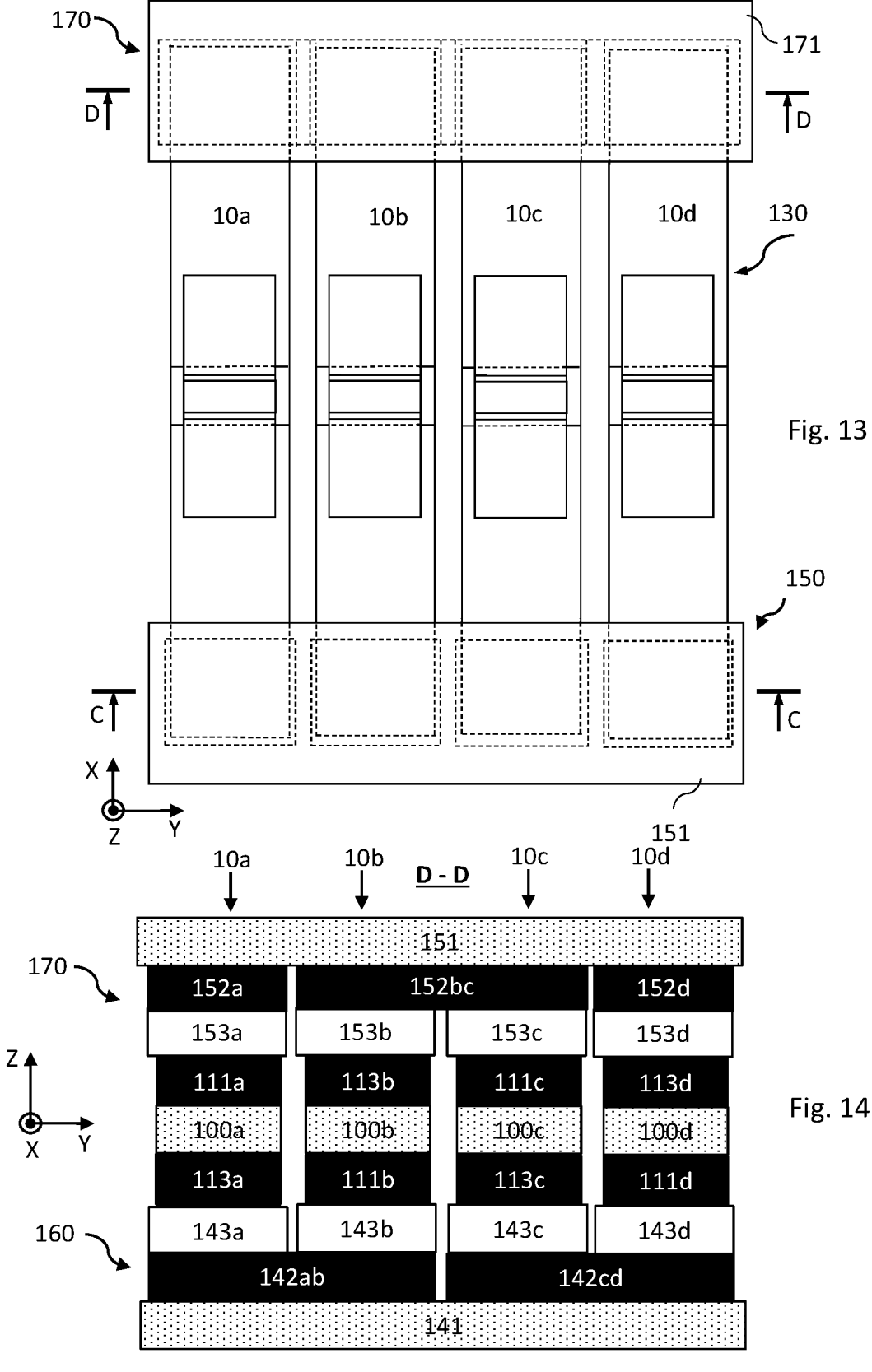
FIG. 13 illustrates a thermoelectric generator.
FIGS. 14 and 15 illustrate cross-sections of the thermoelectric generator, wherein contours being out of the plane of the cross-sections are omitted merely for illustrative purposes.
Figures 15, 16:
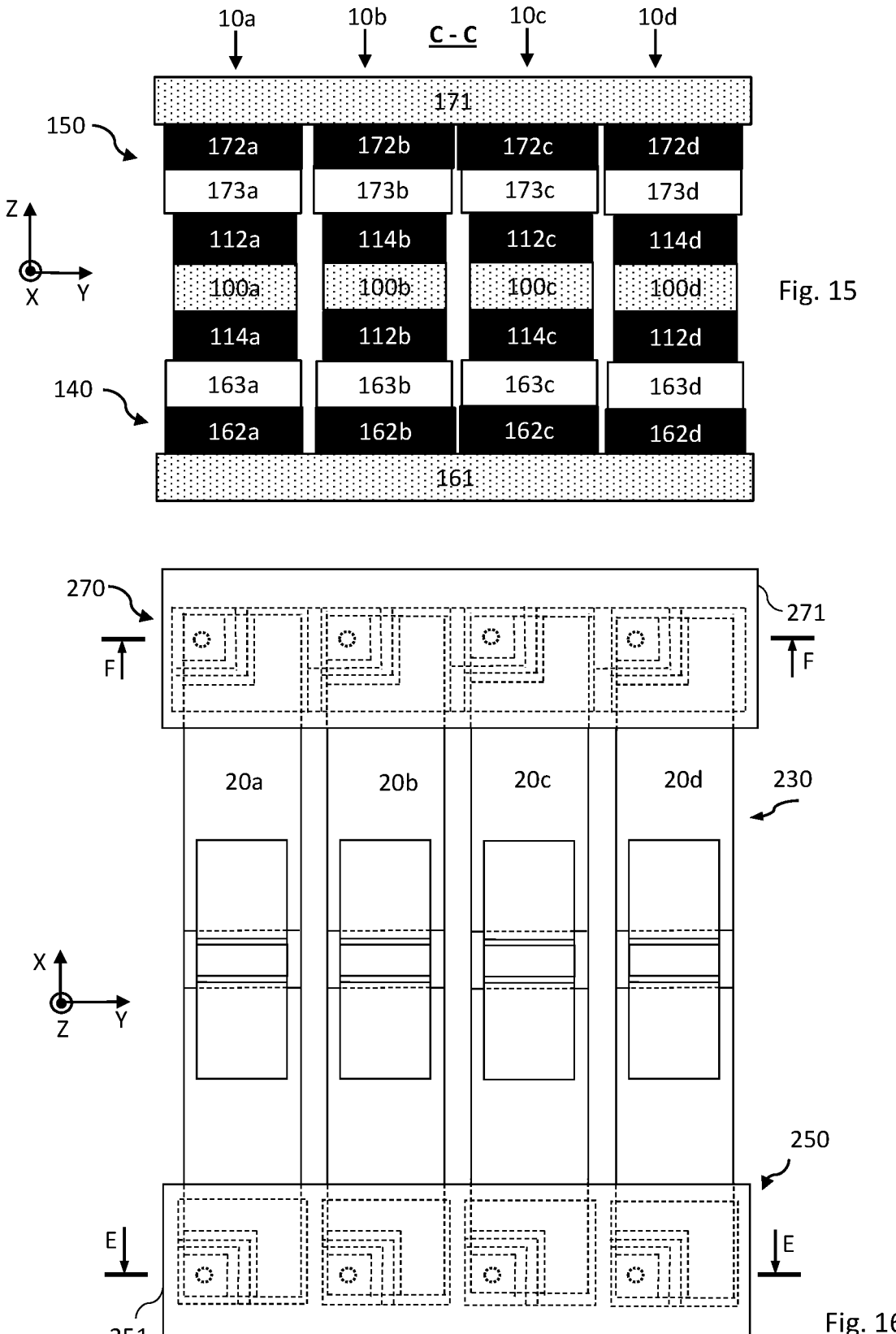
FIG. 16 illustrates another thermoelectric generator.

FIG. 13 illustrates an example implementation 130 of the thermoelectric generator, whereas FIGS. 14 and 15 illustrate its cross-sections. The thermoelectric generator 130 comprises a first interconnect element 170, a second interconnect element 160 and four thermoelectric elements 10, which are numbered as 10a-d in FIG. 13. The thermoelectric generator may further comprise of any one or both optional interconnect elements: a third interconnect element 150 and a fourth interconnect element 140. The first interconnect element 170 comprises a dielectric substrate 151 with three metallisation pads 152a, 152bc, and 152d. The metallisation pad 152bc is positioned between the metallisation pads 152a and 152d. The metallisation pad 152bc is configured for electrical connection (e.g., soldering or brazing) with two metallisation pads of adjacent thermoelectric elements 10. The metallisation pads 152a and 152d are each arranged for electrical connection (e.g., soldering or brazing) with a single metallisation pad of a thermoelectric element. The second interconnect element 160 comprises a dielectric substrate 141 with two metallisation pads 142ab and 142cd, wherein each of the metallisation pads is arranged for electrical connection (e.g., soldering or brazing) with two metallisation pads of adjacent thermoelectric elements 10. Thermoelectric elements 10a-d are arranged in a row. The first 170 and the second 160 interconnect elements can be arranged such that portions of the thermoelectric elements 10a-d comprising the first and the third metallisation pads are sandwiched between the first 170 and the second 160 interconnect elements.

The first metallisation pad 111a on a dielectric substrate 100a of the thermoelectric element 10a is electrically connected to the metallisation pad 152a. The third metallisation pad 113a on the dielectric substrate 100a is electrically connected to the metallisation pad 142ab. The first metallisation pad 111b on a dielectric substrate 100b of the thermoelectric element 10b is electrically connected to the metallisation pad 142ab. The third metallisation pad 113b on the dielectric substrate 100b is electrically connected to the metallisation pad 152bc. The first metallisation pad 111c on a dielectric substrate 100c of the thermoelectric element 10c is electrically connected to the metallisation pad 152bc. The third metallisation pad 113c on the dielectric substrate 100c is electrically connected to the metallisation pad 142cd. The first metallisation pad 111d on a dielectric substrate 100d of the thermoelectric element 10d is electrically connected to the metallisation pad 142cd. The third metallisation pad 113d on the dielectric substrate 100d is electrically connected to the metallisation pad 152d. The electrical connections between the first and the third metallisation pads 111a-d and 113a-d of the thermoelectric elements 10a-d and metallisation pads of the interconnect elements 160 and 170 can be implemented using solder materials or braze filler materials 153a-d and 143a-d as depicted in FIG. 14.

The first and the second interconnect elements 170 and 160 provide for the following electrical chain: the metallisation pad 152a of the first interconnect element 170, the first metallisation pad 111a of the thermoelectric element 10a, a first thermoelectric layer of the thermoelectric element 10a, a second thermoelectric layer of the thermoelectric element 10a, the third metallisation pad 113a of the thermoelectric element 10a, the metallisation pad 142ab of the interconnect element 160, the first metallisation pad 111b of the thermoelectric element 10b, a first thermoelectric layer of the thermoelectric element 10b, a second thermoelectric layer of the thermoelectric element 10b, the third metallisation pad 113b of the thermoelectric element 10b, metallisation pad 152bc, the first metallisation pad 111c of the thermoelectric element 10c, a first thermoelectric layer of the thermoelectric element 10c, a second thermoelectric layer of the thermoelectric element 10c, the third metallisation pad 113c of the thermoelectric element 10c, the metallisation pad 142cd, the first metallisation pad 111d of the thermoelectric element 10d, a first thermoelectric layer of the thermoelectric element 10d, a second thermoelectric layer of the thermoelectric element 10d, the third metallisation pad 113d of the thermoelectric element 10d, the metallisation pad 152d, wherein the elements in this list are electrically connected in series in the same order as they listed.

A voltage generated by the thermoelectric generator 130, when the latter is in operation, is tapped from the metallisation pads 152a and 154d.

The first interconnect element 170 and the second interconnect element 160 may further provide for a thermal coupling of the first and the third metallisation pads 111a-d and 113a-d of thermoelectric elements 10a-d to a heat sink. These interconnect elements 160 and 170 may also affix the thermoelectric elements in the thermoelectric generator 130 thereby providing a modular structure.

The optional third interconnect element 150 comprises a dielectric substrate 171 with four metallisation pads 172a-d each being arranged for connection (e.g., by soldering or brazing) to one metallisation pad of the thermoelectric elements 10a-d. The optional fourth interconnect element 140 comprises a dielectric substrate 161 with four metallisation pads 162a-d each being arranged for connection (e.g., by soldering or brazing) to one metallisation pad of the thermoelectric elements 10a-d. The metallisation pad 172a is connected to a second metallisation pad 112a on the dielectric substrate 100a. The metallisation pad 162a is connected to a fourth metallisation pad 114a on the dielectric substrate 100a. The metallisation pad 172b is connected to a fourth metallisation pad 114b on the dielectric substrate 100b. The metallisation pad 162b is connected to a second metallisation pad 112b on the dielectric substrate 100a. The metallisation pad 172c is connected to a second metallisation pad 112c on the dielectric substrate 100c. The metallisation pad 162c is connected to a fourth metallisation pad 114c on the dielectric substrate 100c. The metallisation pad 172d is connected to a fourth metallisation pad 114d on the dielectric substrate 100d. The metallisation pad 162d is connected to a second metallisation pad 112d on the dielectric substrate 100d. The connections between the second and the fourth metallisation pads 112a-d and 114a-d of the thermoelectric elements 10a-d and metallisation pads of the third interconnect element 150 and the fourth interconnect element 140 can be implemented using solder materials or braze filler materials 173a-d and 163a-d as depicted in FIG. 15.

The third interconnect element 150 and/or the fourth interconnect element 140 may further provide for a thermal coupling of the second and the fourth metallisation pads of thermoelectric elements 10a-d to a heat source. These interconnect elements 150 and 140 may also affix the thermoelectric elements 10a-d in the thermoelectric generator 130 thereby providing a modular structure. The third 150 and the fourth 140 interconnect elements can be arranged such that the portions of the thermoelectric elements 10a-d comprising the second 112a-d and the fourth 114a-d metallisation pads are sandwiched these interconnect elements.

The arrangement of the thermoelectric elements 10a-d in the thermoelectric generator 130 can be expanded to an arbitrary amount of the thermoelectric elements 10. The expanded version of the thermoelectric generator 130 comprises adapted versions of the first and the second interconnect elements 170 and 160. Each of the adapted versions of the first and the second interconnect elements comprise metallisation pads each connecting electrically a pair of the first and the third metallisation pads of respective adjacent thermoelectric elements, wherein the thermoelectric elements are arranged in a row. These interconnect elements may be arranged such that portions of the thermoelectric elements comprising the first and the third metallisation pads are sandwiched between these interconnect elements. When these interconnect elements are considered as loose parts, the metallisation pads of each of these interconnect elements are galvanically insulated from each other.

Said expanded version of the thermoelectric generator 130 may further comprise an adapted version of the optional third interconnect element 150 and/or an adapted version of the optional fourth interconnect element 140. Each of these optional interconnect elements comprises metallisation pads each connected to only one metallisation pad being either the second or the fourth metallisation pad of the respective thermoelectric element. These optional interconnect elements may be arranged such that portions of the thermoelectric elements comprising the second and the fourth metallisation pads are sandwiched between these optional interconnect elements. When these optional interconnect elements are considered as loose parts, the metallisation pads of each of these optional interconnect elements are galvanically insulated from each other.

The thermoelectric generator 130 or its expanded version can be manufactured using a soldering process or a brazing process. For instance, a surface mount soldering process can be employed for the manufacturing. A solder paste is applied to the metallisation pads of the first and the second interconnect elements using a stencil printing or a jet printing. This step may further comprise applying the solder paste to the metallisation pads of the third and/or the fourth interconnect elements when either any one or both of them are used in the thermoelectric generator. In the next step the thermoelectric elements are placed over the first interconnect element such that the metallisation pads of the thermoelectric elements to be soldered with the metallisation pads of the first interconnect element are in contact with the solder paste lumps on the respective metallisation pads of the first interconnect element. In case the thermoelectric generator comprises the third interconnect element, this step is performed in a different way. The first and the third interconnect elements are aligned relative to each other in accordance with their arrangement in the thermoelectric generator, afterwards the thermoelectric elements are placed over the first and the third interconnect elements such that the metallisation pads of the thermoelectric elements to be soldered with the metallisation pads of the first interconnect element are in contact with the solder paste lumps on the respective metallisation pads of the first interconnect element and the metallisation pads of the thermoelectric elements to be soldered with the metallisation pads of the third interconnect element are in contact with the solder paste lumps on the respective metallisation pads of the third interconnect element. In the next step the second interconnect element is placed over a stack of the first interconnect element and the thermoelectric elements such that the metallisation pads of the thermoelectric elements to be soldered with the metallisation pads of the second interconnect element are in contact with solder paste lumps on the respective metallisation pads of the second interconnect element. When the fourth interconnect element is used, this step further comprises placing the fourth interconnect element over the stack of the second interconnect element and the thermo-electric elements such that the metallisation pads of the thermoelectric elements to be soldered with the metallisation pads of the fourth interconnect element are in contact with the solder paste lumps on the respective metallisation pads of the fourth interconnect element. In the last step the entire arrangement of at least the first interconnect element, the thermoelectric elements, and the second interconnect element is processed in a solder oven at elevated temperature to produce solder connections between the metallisation pads.

Brazing process may be used instead of the soldering process in the manufacturing process of the thermoelectric generator. In this case a filler material is used instead of the solder paste and a furnace for brazing process is used instead of the oven. In contrast to the oven, the furnace performs the brazing process at higher temperature than the temperature of the soldering process and may provide as an option an inert atmosphere.

Figures 17, 18:
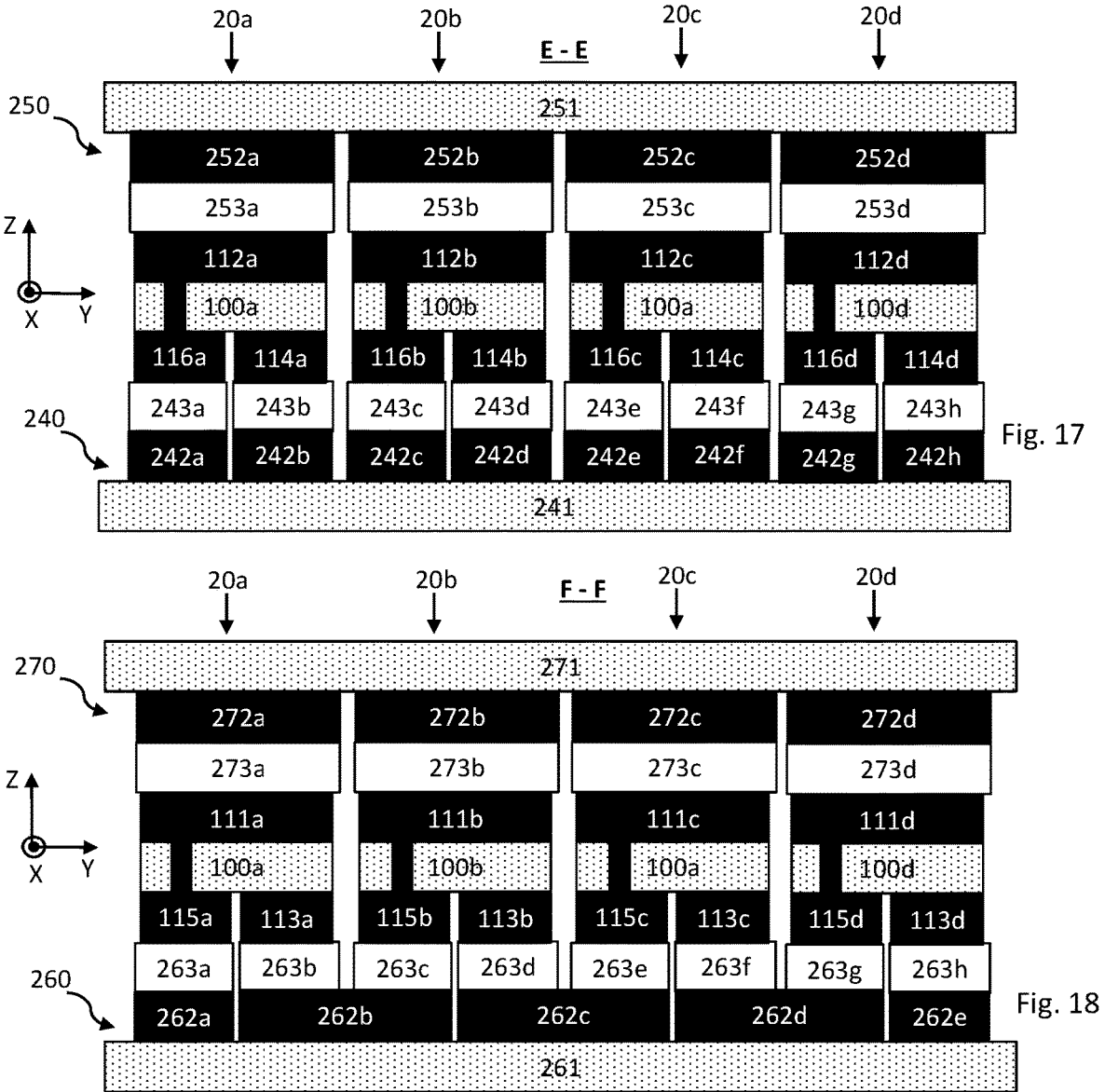
FIGS. 17 and 18 illustrate cross-sections of the other thermoelectric generator, wherein contours being out of the plane of the cross-sections are omitted merely for illustrative purposes.

FIG. 16 illustrates another example implementation 230 of the thermoelectric generator, whereas FIGS. 17 and 18 illustrate its cross-sections. The thermoelectric generator 230 comprises a first interconnect element 260 and four thermoelectric elements 20 arranged in a row, which are numbered as 20a-d in FIG. 16. The thermoelectric generator may further comprise of any arbitrary combination of the following optional interconnect elements: a second interconnect element 270, a third interconnect element 240, and a fourth interconnect element 250. The first interconnect element 260 comprises a dielectric substrate 261 with a row of metallisation pads 262a-e. The first in the row metallisation pad 262a is configured for electrical connection (e.g., soldering or brazing) with only one metallisation pad of the thermoelectric element 20a being the first in the row of the thermoelectric elements. The last in the row metallisation pad 262e is configured for electrical connection (e.g., soldering or brazing) with only one metallisation pad of the thermoelectric element 20d being the last in the row of the thermoelectric elements. Each of the rest of the metallisation pads 262b-d is configured for electrical connection (e.g., soldering or brazing) with a pair of the fifth and the third metallisation pads of thermoelectric elements 20a-d being adjacent in the row of the thermoelectric elements.

The fifth metallisation pad 115a on a dielectric substrate 100a of the thermoelectric element 20a is electrically connected to the metallisation pad 262a. The third metallisation pad 113a on the dielectric substrate 100a is electrically connected to the metallisation pad 262b. The fifth metallisation pad 115b on a dielectric substrate 100b of the thermoelectric element 20b is electrically connected to the metallisation pad 262b. The third metallisation pad 113b on the dielectric substrate 100b is electrically connected to the metallisation pad 262c. The fifth metallisation pad 115c on a dielectric substrate 100c of the thermoelectric element 20c is electrically connected to the metallisation pad 262c. The third metallisation pad 113c on the dielectric substrate 100c is electrically connected to the metallisation pad 262d. The fifth metallisation pad 115d on a dielectric substrate 100d of the thermoelectric element 20d is electrically connected to the metallisation pad 262d. The third metallisation pad 113d on the dielectric substrate 100d is electrically connected to the metallisation pad 262e. The electrical connections between the first and the fifth metallisation pads 115a-d and 113a-d of the thermoelectric elements 20a-d and metallisation pads 262a-e of the first interconnect element 260 can be implemented using solder materials or braze filler materials 263a-h as depicted in FIG. 18.

The first interconnect element 260 provides for the following electrical chain: the metallisation pad 262a, the fifth metallisation pad 115a of the thermoelectric element 20a, the first metallisation pad 111a of the thermoelectric element 20a, a first thermoelectric layer of the thermoelectric element 20a, a second thermoelectric layer of the thermoelectric element 20a, the third metallisation pad 113a of the thermoelectric element 20a, the metallisation pad 262b, the fifth metallisation pad 115b of the thermoelectric element 20b, the first metallisation pad 111b of the thermoelectric element 20b, a first thermoelectric layer of the thermoelectric element 20b, a second thermoelectric layer of the thermoelectric element 20b, the third metallisation pad 113b of the thermoelectric element 20b, the metallisation pad 262c, the fifth metallisation pad 115c of the thermoelectric element 20c, the first metallisation pad 111c of the thermoelectric element 20c, a first thermoelectric layer of the thermoelectric element 20c, a second thermoelectric layer of the thermoelectric element 20c, the third metallisation pad 113c of the thermoelectric element 20c, the metallisation pad 262d, the fifth metallisation pad 115b of the thermoelectric element 20d, the first metallisation pad 111d of the thermoelectric element 20d, a first thermoelectric layer of the thermoelectric element 20d, a second thermoelectric layer of the thermoelectric element 20d, the third metallisation pad 113d of the thermoelectric element 20d, the metallisation pad 262e, wherein the elements in this list are electrically connected in series in the same order as they listed. A voltage generated by the thermoelectric generator 230, when the latter is in operation, is tapped from the metallisation pads 252a and 262e.

The first interconnect element 260 may further provide for a thermal coupling of the fifth and the third metallisation pads 115a-d and 113a-d of the thermoelectric elements 20a-d to a heat sink. The first interconnect element 260 may further provide a thermal coupling of the first metallisation pads 111a-d to the heat sink via the fifth metallisation pads 115a-d and thermal couplings (e.g., via 117 in FIG. 2) between the first and the fifth metallisation pads. The first interconnect element 260 may also affix the thermoelectric elements in the thermoelectric generator 230 thereby providing a modular structure.

The optional second interconnect element 270 of the thermoelectric generator 230 can be arranged in a similar way as the third interconnect element 150 or the fourth interconnect element 140 of the thermoelectric generator 130. The first 260 and the second 270 interconnect elements can be arranged such, that portions of the thermoelectric elements 20a-d comprising the first 111a-d, third 113a-d, and the fifth 115a-d metallisation pads are sandwiched between these interconnect elements 260 and 270. The second interconnect element comprises a dielectric substrate 271 with four metallisation pads 272a-d. Each of the metallisation pads 272a-d is arranged for connection with a first metallisation pad 111a-d of the respective thermoelectric element 20a-d as depicted in FIG. 18. The connections between the metallisation pads 272a-d and the first metallisation pads 111a-d can be implemented using solder materials or braze filler materials 273a-d. The second interconnect element 270 may further provide for a thermal coupling of the first metallisation pads 111a-d of the thermoelectric elements 20a-d to a heat sink. The second interconnect element 270 may also affix the thermoelectric elements in the thermoelectric generator 230 thereby providing a modular structure.

The optional third interconnect element 240 comprises a dielectric substrate 241 with eight metallisation pads 242a-h (FIG. 17). Each of the metallisation pads 242a-h is affixed to a respective metallisation pad of an alternating sequence of the fourth 114a-d and the sixth 116a-d metallisation pads of the thermoelectric elements 20a-d. In case the thermoelectric elements 20a-d have only the third 113a-d, the fourth 114a-d, and the fifth 115a-d metallisation pads on their second sides (i.e., the thermoelectric elements do not have the sixth metallisation pads 116a-d), the third interconnect element of the thermoelectric generator 230 can be implemented in a similar way as the third 150 or the fourth 140 interconnect element of the thermoelectric generator 130. In this case the third interconnect element of the thermoelectric generator 230 comprises a dielectric substrate with four metallisation pads each being connected to the fourth metallisation pad of the respective thermoelectric element. The connections between the metallisation pads of the thermoelectric elements and the metallisation pads of the third interconnect element 240 can be implemented using solder materials or braze filler materials (e.g., elements 243a-h in FIG. 17). The third interconnect element of the thermoelectric generator 230 may provide for a thermal coupling of the fourth metallisation pads of the thermoelectric elements to a heat source. In case the thermoelectric elements comprise the sixths metallisation pads the third interconnect element may provide a thermal coupling of the sixth metallisation pads to the heat source. A thermal coupling of the second metallisation pads 112a-d to the heat source may be provided via the sixth metallisation pads 116a-d and thermal couplings (e.g., via 118 in FIG. 2) between the second and the sixth metallisation pads 116 a-d. The third interconnect element of the thermoelectric generator 230 may also affix the thermoelectric elements in the thermoelectric generator thereby providing the modular structure.

The optional fourth interconnect element 250 comprises a dielectric substrate 251 with four metallisation pads 252a-d (FIG. 17). Each of the metallisation pads 252a-d is affixed to a second metallisation pad 112a-d of the respective thermoelectric element 20a-d. The connections between the second metallisation pads 112a-d of the thermoelectric elements 20a-d and the metallisation pads 252a-d of the fourth interconnect element 250 can be implemented using solder materials or braze filler materials (e.g., elements 253a-d in FIG. 17). The fourth interconnect element 250 of the thermoelectric generator 230 may further provide for a thermal coupling of the second metallisation pads 112a-d of the thermoelectric elements 20a-d to the heat source. The fourth interconnect element 250 may also affix the thermoelectric elements in the thermoelectric generator 230 thereby providing a modular structure. The third 240 and the fourth 250 interconnect elements can be arranged such, that portions of the thermoelectric elements 20a-d comprising the second 113a-d, fourth 114a-d, and as option the sixth 116a-d metallisation pads are sandwiched between these interconnect elements 240 and 250.

The arrangement of the thermoelectric elements 20a-d in the thermoelectric generator 230 can be expanded to an arbitrary amount of the thermoelectric elements 20. The expanded version of the thermoelectric generator 130 comprises an adapted version of the first interconnect element 260. This version of the first interconnect element 260 comprises metallisation pads each connecting electrically a pair of the third and the fifth metallisation pads of respective adjacent thermoelectric elements, wherein the thermoelectric elements are arranged in a row. The expanded version of thermoelectric generator 130 may further comprise an interconnect element being an adapted version of the optional second interconnect element 270. This version of the second interconnect element comprises metallisation pads each connected to only one first metallisation pad of the respective thermoelectric element. The adapted versions of the first and the second interconnect elements may be arranged such, that portions of the thermoelectric elements comprising the first, the third, and the fifth metallisation pads are sandwiched between these interconnect elements. When these interconnect elements are considered as loose parts, the metallisation pads of each of these interconnect elements are galvanically insulated from each other.

The expanded version of the thermoelectric generator 230 may further comprise of any one or both interconnect elements being adapted versions of the optional third and fourths interconnect elements, respectively. The adapted version of the fourth interconnect element 250 comprises metallisation pads each connected to only one second metallisation pad of the respective thermoelectric element. The adapted version of the third interconnect element 240 comprises metallisation pads each connected to only one fourth metallisation pad of the respective thermoelectric element. The adapted version of the third interconnect element may comprise further metallisation pads each connected to only one sixth metallisation pad of the respective thermoelectric element. These optional interconnect elements may be arranged such that portions of the thermoelectric elements comprising the second, the fourth, and as option the sixth metallisation pads are sandwiched between these optional interconnect elements. When these optional interconnect elements are considered as loose parts, the metallisation pads of each of these optional interconnect elements are galvanically insulated from each other.

The thermoelectric generator 230 or its extended version can be manufactured using method employing the soldering process or the brazing process as described above.

Figures 19, 20, 21, 22, 23, 24, 25, 26, 27, 28:
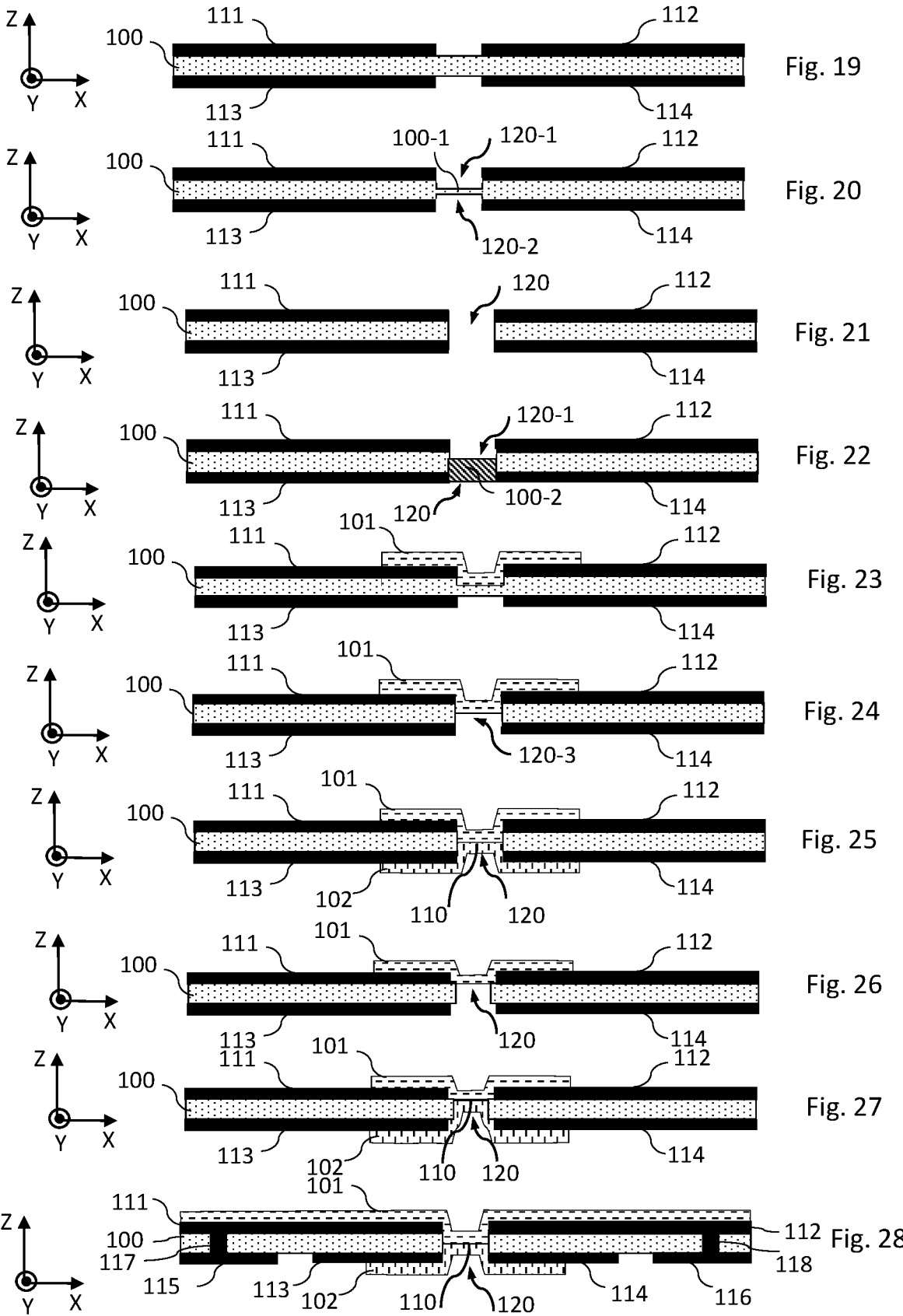
FIGS. 19-27 illustrate steps of methods for manufacturing thermoelectric elements, wherein contours being out of the plane of the cross-sections are omitted merely for illustrative purposes.
FIG. 28 illustrates a cross-section of a thermoelectric element, wherein contours being out of the plane of the cross-section are omitted merely for illustrative purposes.

FIGS. 19-25 illustrate methods of manufacturing of any of the thermoelectric elements employing p-n junctions described above, except for the thermoelectric element depicted in FIG. 8. These figures illustrate cross-sections of the thermoelectric element at different stages of its manufacturing. The method begins with providing a dielectric substrate 100 with the first, second, third, and fourth metallisation pads 111-114 (FIG. 19). The metallisation pads 111-114 are placed on the dielectric substrate in the same way as the metallisation pads 111-114 described above. Any one or ones of the metallisation pads 111, 112, 113, or 114 may comprise several layers as described above, e.g. the structured layer and its coating. Any of the metallisation pads 111-114 may have a tapered sidewall as described above. The dielectric substrate may comprise the optional fifth and/or the sixth metallisation pads connected to the first and the second metallisation pads, respectively, as described above. The optional fifth and sixth metallisation pads are omitted in a cross-section of the dielectric wafer 100 and the metallisation pads depicted FIGS. 19-27 merely for illustrative purposes. The first metallisation pad 111 is separated by a first gap from the second metallisation pad 112 on the first side of the dielectric substrate. The third metallisation pad 113 is separated by a second gap from the fourth metallisation pad 114 on the second side of the dielectric substrate.

A next step depicted in FIG. 20 is optional. In this step a recess 120-1 is made in the dielectric substrate 100 in the first gap separating the first and the second metallisation pads 111 and 112 and/or an auxiliary recess 120-2 is made in the dielectric substrate 100 in the second gap separating the third and the fourth metallisation pads 113 and 114. The recess 120-1 and the auxiliary recess 120-2 can be made by laser ablation, preferably by photoablation. The photoablation may be advantageous, because it provides for a pure ablation of a material without (substantial) thermal lesions. As it will be evident from the description of the next steps, a depth of the recess 120-1 in a direction perpendicular to a plane defined by the first side of the dielectric substrate (i.e., in negative Z direction in FIG. 20) defines a position of the interface 110 between the first and the second thermoelectric layers 101 and 102. The interface 100 can be but is not limited to: a p-n interface of the p-n junction or p-i or i-n interface of the p-i-n junction. When the recess 120-1 is not made the interface 110 is in the plane defined by the first side of the dielectric substrate 100. The constraints for positioning the interface 110 mentioned above may determine whether the recess 120-1 is to be made as such or its depth, when the recess 120-1 is made. Independent of the recess 120-1 the depth of the auxiliary recess 120-2 guarantees that only the remaining thin portion 100-1 of the substrate material must be removed at a later stage of manufacturing when the hole 120 is completed after forming the first thermoelectric layer 101. Such a thinning of the substrate may be of advantage because it may reduce thermomechanical stress caused in the first thermoelectric layer when the hole 120 is almost completed by the laser ablation and the laser radiation reaches the material of the first thermoelectric layer 101 in the gap. Removal of the remaining thin portion 100-1 of the substrate 100 between two recesses 120-2 and 120-1, when the latter is made, or between the auxiliary recess 120-2 and the first side of the substrate, when the recess 120-1 is not made, requires less laser fluence in comparison to making the hole 120 through the entire substrate 100 or a substantial portion thereof. As a result thereof, a risk of damage of the first thermoelectric layer may be reduced, in particular when the substrate is thinned up to a thickness below 10 μm, preferably below 1 μm. The thinning of the substrate below 5 μm, preferably below 1 μm, by making the recess 120-1 and/or the auxiliary recess 120-2 may enable employing other methods for removing the remaining thin portion 100-1 of the wafer material which have lower potential risks of damaging the first thermoelectric layer 101 in comparison with the laser ablation. For instance, the remaining thin portion of the substrate material can be removed by ion beam etching after the formation of the first thermoelectric layer, wherein atoms or ions of an inert gas preferably having energy more than 100 eV, preferably more than 500 eV, bombard a substrate surface. Since this etching method is not selective, i.e. it etches each exposed material the thickness of the thinned portion of the substrate to etched has to be low to minimize etching of other elements of the thermoelectric element (e.g. the third and the fourth metallisation pads 113 and 114) exposed during the enticing.

Instead of the steps depicted in FIGS. 19 and 20, the method can begin with a step depicted in FIG. 21, wherein the hole 120 is made completely in the substrate 100 as in the thermoelectric elements depicted in FIGS. 1-7 and 9-12. The hole 120 can be made by laser ablation, preferably by photoablation. Providing the wafer 100 with the hole 120 and the metallisation pads 111-114 as in the thermoelectric elements depicted in FIGS. 1-7 and 9-12 can be an alternative starting point of the method of manufacturing the thermoelectric element.

After making the hole 120 or after providing the substrate with the hole 120 and metallisation pads 111-114 as depicted in FIG. 21, the hole 120 is at least partially filled with a sacrificial material 100-2, which preferably has high etching selectivity with respect to one or more of the following materials: a material of the substrate 100, a material of the metallisation pad 113 or its coating, when the latter is used, a material of the metallisation pad 114 or its coating, when the latter is used, a material of the first thermoelectric layer. Details of this procedure are explained further in the text. When a plane of the first side of the substrate 100, on which the metallisation pads 111 and 112 is located, is above a top surface of the sacrificial material in positive Z direction, as for instance depicted in FIG. 22, a recess 120-1 in the first gap separating the metallisation pads 111 and 112 is constituted by the top surface of the sacrificial material 100-2 and portions of the sidewalls of the hole 120, which are devoid from the sacrificial material. As it will be evident from the description of the next steps, an upper surface of the sacrificial material 100-2 in positive Z direction defines a position of the interface 110 between the first and the second thermoelectric layers 101 and 102.

After the providing the dielectric substrate with the metallisation pads and without the hole 120 as depicted in FIG. 19 or after filling the hole 120 at least partially with the sacrificial material 100a as depicted in FIG. 22 or after the optional building of the recess(es) 120-1 and/or 120-2 in the dielectric substrate 100 as depicted in FIG. 20, when the latter is performed, the first thermoelectric layer 101 is formed on the first side of the dielectric substrate 100 (FIG. 23). The auxiliary recess 120-2 made in the processing step depicted in FIG. 20 and the sacrificial material 100-2 built in the hole 120 in the processing step depicted in FIG. 22 are not depicted in FIG. 23. The first thermoelectric layer 101 is formed at least in the first gap and in the recess 120-1, when the latter is made. The first thermoelectric layer 101 is in direct contact with the first 111 and the second 112 metallisation pads. The first thermoelectric layer may be formed by an additive process like inkjet printing or aerosol deposition method. Alternatively, the first thermoelectric layer may be formed by depositing the thermoelectric layer on the entire dielectric substrate with metallisation pads. Afterwards, when necessary, portions of the first thermoelectric layer may be removed to produce portions of the first and/or the second metallisation pads devoid of the first thermoelectric layer. The removal of the portions of the first thermoelectric layer can be performed by the laser ablation, preferably by the photoablation for the reasons mentioned above. As option the first thermoelectric layer can be annealed in oven after its deposition or after its structuring, when the latter is used. The annealing may be used for improving a crystal structure of the first thermoelectric layer and/or for sintering together nanoparticles of the first thermoelectric layer, when it is printed using an ink of the inkjet printing process. An optional surface cleaning of the first side of the substrate can be made prior deposition of the first thermoelectric layer 101. The surface cleaning can be made for instance by inert gas plasma cleaning or by ion etching, wherein ions or atoms of an inert gas (e.g., argon) bombard a surface of the first side of the substrate 100. When the specific deposition method of the first thermoelectric layer 101 is compatible with vacuum technology, the cleaning step and the subsequent deposition step can be made without breaking the vacuum.

After the forming of the first thermoelectric layer 101 the sacrificial material 100-2 is removed, when the hole 120 was made and at least partially filled with the sacrificial material 100-2, e.g. by inkjet printing, before the forming of the first thermoelectric layer 101. As mentioned above, the removal of the sacrificial material can be made by the selective etching e.g. by oxygen plasma etching/ashing. AIs alternative, the sacrificial material 100-2 can be removed by solving the organic material in a solvent. For instance, a solvent for UV cured inks (i.e. UV cured sacrificial material) is commercially available from the INX Digital International Co. When the hole 120 was not completed before the forming of the first thermoelectric layer 101 it is completed by making a recess 120-3 in the dielectric substrate 100 in the second gap starting from the second side of the dielectric substrate 100 or from the bottom of the auxiliary recess 120-2, when the latter is made. The recess 120-3 reaches the first thermoelectric layer in the first gap. The recess 120-3 can be made the by laser ablation, preferably by the photoablation. When the substrate was thinned up to a thickness less than 5 μm, preferably less than 1 μm, by making the recess 120-1 and/or the auxiliary recess 120-2 the hole can be completed by the ion beam etching as described above. When the thickness of the substrate material to be removed is equal to or bigger than 5 μm, the recess 120-3 can be made in two stages, wherein in the first stage a first portion of the recess 120-3 is made such that the remaining thickness of the substrate material to be removed is less than 5 μm, preferably less than 1 μm, and in the second stage the recess 120-3 is completed by the ion beam etching. Independent of the specific manufacturing method the complete recess 120-3 reaches the first thermoelectric layer in the first gap. Independent of the specific manufacturing method the hole 120 may have any of the shapes described above. The tapering of the sidewalls can be made in any of the steps depicted in FIGS. 20, 21, and 24, when the hole 120 is made or completed and/or when one or more of the recesses 120-1, 120-2, or 120-3 is(are) made. The hole 120 has a first opening on the first side of the dielectric substrate 100 and the second opening on the second side of the dielectric substrate 100. The first opening is covered by the first thermoelectric 101 layer in the first gap. As option the first thermoelectric layer can be annealed after the building of the hole 120 and before forming the second thermoelectric layer 102 in the next step. The annealing may be used for the same purpose as in the previous step of the forming the first thermoelectric layer.

After the hole 120 is built or the sacrificial material 100-2 is removed the second thermoelectric layer 102 is formed at least in the hole 120 (FIG. 25). The second thermoelectric layer is in direct contact with the third 113 and the fourth 114 metallisation pads. The second thermoelectric layer may be formed in the same way as the first thermoelectric layer including an optional annealing. The second thermoelectric layer 102 is formed such, that at least portions of the third 113 and the fourth 114 metallisation pads are devoid of the second thermoelectric layer 102. When the dielectric substrate comprises the fifth and/or the sixth metallisation pads on its second side, the second thermoelectric layer is formed such that at least portions of these metallisation pads are devoid of the second thermoelectric layer 102. To improve the quality of interface 110 between the first 101 and the second 102 thermoelectric layers a surface of the first thermoelectric layer 101 in the hole 120 may be cleaned by plasma or ion milling before the deposition of the second thermoelectric layer 102 on this surface as described above. The cleaning of the surface and the deposition of the second thermoelectric layer are performed preferably without exposing the cleaned surface to oxygen and other contaminants, when the deposition of the second thermoelectric layer 102 is compatible with such processing. This can be implemented by using a cluster tool having plasma (or ion beam) cleaning and deposition chambers.

FIG. 26 illustrates a cross-section of the thermoelectric element after the forming of the first thermoelectric layer

101 and completing the hole 120, when the recess 120-1 was not made, or after the removal of the sacrificial material 100-2, which was used to fill the hole 120 completely. FIG. 27 illustrates a cross-section of this thermoelectric element after formation of the second thermoelectric layer 102. In order to avoid a situation when at least one of the first and the second metallisation pads is in direct contact with each of the first and the second thermoelectric layers the recess 120-2 (i.e., the hole 120) or at least the first opening of the hole on the first side of the dielectric substrate is built narrower than a distance between the first and the second metallisation pads in X direction, i.e. the direction of the thermal gradient, when the thermoelectric element is in operation. Further details regarding the arrangement of the metallisation pads 111-114 relative to the first 101 and the second 102 thermoelectric layers are described above. In case, when the dielectric substrate 100 is provided with the hole 120 and the hole 120 is completely filled with the sacrificial material 100-2, the hole 120 or at least its first opening on the first side of the dielectric substrate 100 is also narrower in X direction as mentioned above to avoid the situation when the first and/or the second metallisation pad 111 and/or 112 is in direct contact with the first and the second thermoelectric layers 101 and 102. The criterion for the shape of the hole of the of thermoelectric element depicted in FIGS. 26 and 27 may be formulated using mathematical rigor. Neither a contour of the first metallisation pad 111 in a plane of the first side of the dielectric substrate 100 nor a contour of the second metallisation pad 112 in the plane of the first side of the dielectric substrate 100 have one or more common points with a contour of the first opening of the hole 120 in the plane of the first side of the dielectric substrate 100.

FIG. 28 illustrates a cross-section of the thermoelectric element manufactured according to any of the methods described above. The thermoelectric element comprises the fifths and the sixth metallisation pads. Since all connections of to the thermoelectric element can be implemented using the metallisation pads 115, 113, 114, and 116 on the second side of the dielectric substrate 100 the structuring of the first thermoelectric layer 101 may be omitted.

FIGS. 29-35 illustrate methods of manufacturing of any thermoelectric element employing a p-n or p-i-n junction described above, except the thermoelectric element depicted in FIG. 8. The steps of the methods depicted in FIGS. 29-35 are based on the steps of the methods depicted in FIGS. 19-28. As it will be clear from the further description utilisation of additional materials in the methods depicted in FIGS. 29-35 enables manufacturing of the thermoelectric element employing the p-n or p-i-n junction, wherein at least one of the thermoelectric layers building the p-n or p-i-n junction has a dopant gradient and/or different portions having different charge carrier concentrations as described above. More specifically, the p-n or p-i-n junction is built by using at least one thermoelectric layer 101 or 102 having specific composition and at least one metallisation pad 111-114 having a specific composition, whereas deposition, structuring, etching, and making recesses in the method steps depicted in FIGS. 29-35 are the same as or substantially similar to the respective processing procedures in the steps of the methods depicted in FIGS. 19-28. In other words, the methods depicted in FIGS. 29-35 may be considered as a further extension of the methods depicted in FIGS. 19-28.

One of the methods depicted in FIGS. 29-35 begins with providing the substrate 100 with the metallisation pads 111-114 as in the method step depicted in FIG. 19 described above. In addition, at least one of the metallisation pads has a coating which atoms are dopants for thermoelectric layer which will be deposited on this metallisation pad at a later process step. For instance, a metallisation pad comprising structured copper layer coated with nickel functions a drive-in source of p-type nickel dopants for a Bi2Te3-based thermoelectric layer when a stack the metallisation pad and the adjacent thermoelectric layer is heated above 200 degrees Celsius. In the specific example depicted in FIGS. 29-35 each metallisation pad 111-114 comprises a respective pair of the structured layer 111-2, 112-2, 113-2, or 114-2 and its coating 111-1, 112-1, 113-1, or 114-1 as the thermoelectric element depicted in FIG. 7. In case of SiGe-based thermoelectric layer a coating comprising one or more of the following elements Li, Sb, P, or As can be used for drive-in n-doping and a coating comprising one or more of the following elements B, Al, or Ga can be used for drive-in p-doping.

In the next step depicted in FIG. 30 a recess 120-1 in the first gap separating the first and the second metallisation pads 111 and 112 is made in the same way as in the process step depicted in FIG. 20. An optional recess 120-2 in the second gap separating the third and the fourth metallisation pads 113 and 114 can be made as well as described above. The recess 120-1 can be formed in an alternative way, by partially filling the hole 120 in the substrate 100 with the sacrificial material 100-2 as described above, wherein, before the partially filling the hole 120 with the sacrificial material 100-2, the substrate 100 with the hole 120 is initially provided or the hole 120 is completely made in the substrate 100 as described above. The alternative employing the sacrificial material 100-2 is not depicted in FIGS. 29-35.

After forming the recess 120-1 and the optional recess 120-2, when the latter is made, the first thermoelectric layer 101 is formed using deposition methods and, when necessary, structuring methods as described above. The first thermoelectric layer can be formed such that is has a dopant concentration gradient in positive Z direction, wherein its interface portion 101-1 being closer to the dielectric substrate 100 (or the interface 110 formed at a later stage) than its remote portion 101-2 is not doped or has a lower average dopant concentration than its other portion (FIG. 31). Utilisation of CVD methods for deposition of the first thermoelectric layer (e.g., SiGe-based thermoelectric layer) can be used for deposition of a thermoelectric layer having a dopant concentration gradient by changing (increasing) a concentration of a precursor of containing dopant throughout its deposition. Alternatively, the first thermoelectric layer can be deposited as a plurality of layers stepwise, wherein each next layer deposited in a dedicated CVD process has higher dopant concentration than a layer deposited in another CVD process immediately before said each next layer or wherein a material of each next deposited layer has higher charge carrier concentration than a material of the layer deposited immediately before said next layer. The latter option can be implemented by using sputtering targets having different chemical compositions for sputter-deposition of different consecutive layers or particles of different chemical composition can be used in inkjet deposition or aerosol deposition processes for depositing different consecutive layers.

Forming of the recess 120-1 may be of advantage for ink-jet process, in particular for the layer-wise deposition process. The recess 120-1 can serve a confinement tub for an ink. Moreover, one or more layers of the first thermoelectric layer can be inkjet-deposited in the recess 102-1 such that they do not contact the first 111 and the second 112 metallisation pad, whereas the last layer of the layer stack can be inkjet-deposited such that it contacts the previous layer and the first 111 and the second 112 metallisation pad.

In case of using inkjet process for deposition of the first thermoelectric layer 101 it is annealed to sinter the inkjet-deposited particles immediately after the inkjet deposition. In other cases, the first thermoelectric layer 101 can be annealed immediately after its deposition or at any later stage of the method. The annealing can be used for improving of crystalline properties of the thermoelectric layer. The annealing can be also used for causing the dopants in the first metallisation pad 111 and/or second metallisation pad 112 to diffuse into the respective adjacent fragments 101-1b and 101-1a of the interface portion 101-1 of the first thermoelectric layer 101, whereas a chemical composition of its fragment 101-1c adjacent to a bottom of the recess 120-1 or the first surface of the dielectric substrate 100 (i.e. to the interface 110 at a later manufacturing stage) and remote from the first and the second metallisation pads 111 and 112 does not change or its change is negligible (FIG. 33). As a result, an ohmic contact or electrical contact having low electrical resistance is built between the first thermoelectric layer 101 and the adjacent metallisation pad 111 or 112, which acted as the source for dopant drive-in diffusion into the first thermoelectric layer. The fragment 101-1c depicted in FIGS. 32-35 corresponds to the interface portion 101-1 of the first thermoelectric layer 101 of the thermoelectric element depicted in FIG. 7, i.e. it has the electrical properties and serves the same purpose as the interface portion 101-1. The fragment 101-1c can be low-doped or not doped portion of the first thermoelectric layer 101 or a fragment of one layer or fragments of layers deposited in a layer-wise deposition process, which material(s) has(have) lower charge carrier concentrations than at least one layer deposited after said one or more layers. The premise of the safe drive-in of dopants in the first thermoelectric layer 101 is, that the dopants diffused out of the metallisation pad do not reach the interface 110. This can be achieved by configuring the hole 120 and/or positioning the interface 110 such, that the metallisation pad comprising dopants for the thermoelectric layer is spaced from the interface 110 at a distance bigger than a characteristic dopant diffusion length, a length to which dopants spread within target material (thermoelectric layer) during thermal treatment (anneal), preferably this distance is at least twice bigger than the characteristic diffusion length, more preferably this distance is at least three times bigger than the characteristic diffusion length. The characteristic diffusion length is connected to the diffusion coefficient and anneal duration via the following formula $2*sqrt(D*t)$, where sqrt stands for the square root, D is the diffusion coefficient of the dopant in the target material, and t is the anneal duration. This criterion may be formulated using mathematical rigor as follows: a shortest distance between the metallisation pad 111 or 112 and the interface 110 must be bigger than the characteristic diffusion length, preferably at least twice bigger, more preferably at least three times bigger. As can be seen from FIG. 32 the aforementioned criteria can be complied with not only by making the recess 120-1 deep enough but by spacing a contour of the first opening of the hole on the first side of the substrate apart from the first and the second metallisation pads 111 and 112 as depicted in FIG. 27.

After the forming of the first thermoelectric layer 101 or after its annealing, when the latter is performed, the sacrificial material in the hole 120 is removed as described above or the hole 120 is completed by removing the remaining portion of the substrate material as described above. Afterwards as an option the first thermoelectric layer can be annealed to improve crystalline properties of a surface of the first thermoelectric layer in the hole and/or to cause the dopant drive-in diffusion into the first thermoelectric layer, when the latter is not performed previously.

As the next step the second thermoelectric layer 102 is formed (FIG. 34). It is in direct contact with the third and the fourth metallisation pads 113 and 114. The first and the second thermoelectric 101 and 102 contact each other via the hole 120 at the interface 110. The forming of the second thermoelectric layer 102 includes deposition and, when necessary, its structuring, wherein as an option the surface of the first thermoelectric layer in the hole 120 and/or surfaces of the metallisation pads 113 and 114 can be cleaned prior to the deposition of the second thermoelectric layer 102 as described above. The second thermoelectric layer 102 can be formed in the same way as in the methods depicted in FIGS. 19-28. The formed second thermoelectric layer can be annealed as described above. It is important to note that the second thermoelectric layer 102 is in direct contact only with the portion 101c-1 of the first thermoelectric layer 101, i.e. the portion of the first thermoelectric layer which chemical composition is not affected by the dopants diffused in from the first and/or the second metallisation pads.

As alternative, the second thermoelectric layer 102 can be formed in the same way as the first thermoelectric layer 101 (FIG. 35). As deposited it may have a dopant concentration gradient in a negative Z direction or it may be deposited as a plurality of layers stepwise as described above for the first thermoelectric layer 101. Dopants from a coating 113-1 of the third metallisation pad 113 are driven-in into an adjacent fragment 102-1b of the second thermoelectric layer 102. Dopants from a coating 114-1 of the fourth metallisation pad 114 are driven-in into an adjacent fragment 102-1a of the second thermoelectric layer 102, whereas a chemical composition of a second thermoelectric layer fragment 102-1c adjacent to the first thermoelectric layer 101, i.e. to the interface 110, and remote from the third and the fourth metallisation pads 113 and 114 is not changed or its change is negligible after the drive-in diffusion of dopants. As a result, an ohmic contact or an electrical contact having low electrical resistance is built between the second thermoelectric layer 101 and the adjacent metallisation pad 113 or 114, which acted as the source for dopant drive-in diffusion into the second thermoelectric layer 102. The fragment 102-1c depicted in FIG. 35 corresponds to the interface portion 102-1 of the thermoelectric layer depicted in FIG. 7, i.e. it has the electrical properties and serves the same purpose as the portion 102-1. The fragment 102-1c can be low-doped or not doped portion of the second thermoelectric layer 102 or a fragment of one layer or fragments of layers deposited in a layer-wise deposition process, which material(s) has(have) lower charge carrier concentrations than at least one layer deposited after said one or more layers. The premise of the safe drive-in of dopants in the second thermoelectric layer 102 is the same as for the first thermoelectric layer 101.

Since the purpose of the dopant drive-in is creation of low-resistivity and/or ohmic contacts between the adjacent metallisation pads and thermoelectric layers and only two metallisation pads 111 and 113 or 112 and 114 are used for electrical connection, two metallisation pads having coatings comprising dopants for drive-in procedure are sufficient. These metallisation pads face each other and be separated by the substrate. In other words, they are on the same side from the hole 120.

Figures 36, 37, 38, 39, 40, 41, 42, 43:
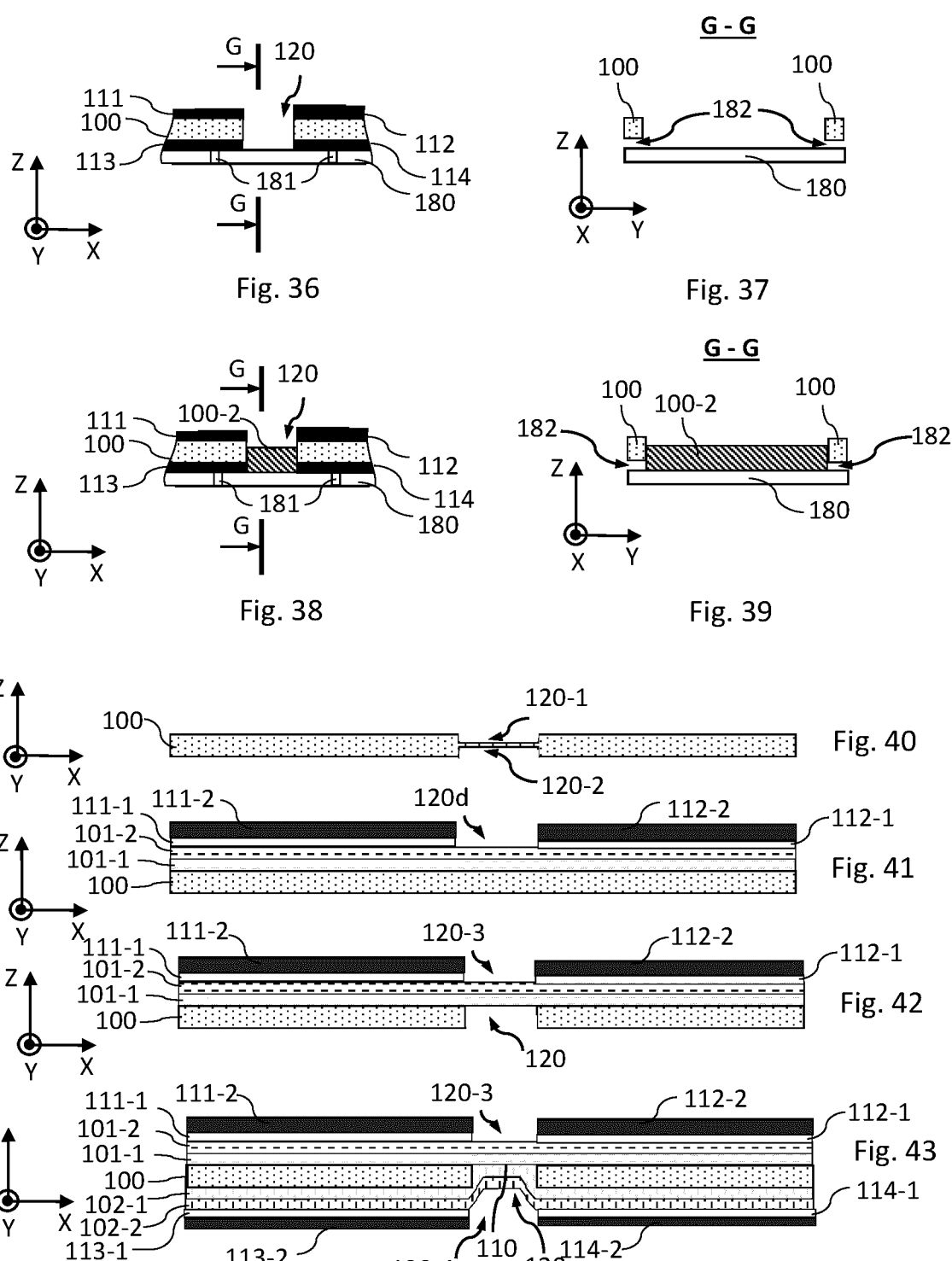
FIGS. 36-39 illustrate processing steps for filling a hole in a substrate with a sacrificial material, wherein contours being out of the plane of the cross-sections are omitted merely for illustrative purposes.
FIGS. 40-43 illustrate steps of methods for manufacturing thermoelectric elements, wherein contours being out of the plane of the cross-sections are omitted merely for illustrative purposes.

FIGS. 36-39 illustrate a process of filling the hole 120 with the sacrificial material 100-2. FIG. 36 illustrates a X-Z plane cross-section of a central portion of the dielectric substrate having metallisation pads 111-114 and the hole 120. The substrate is clamped to a substrate holder 181. For instance, the clamping can be made electrostatically or by vacuum suction. The vacuum channels 181 providing vacuum suction reach the third and the fourth metallisation pads 113 and 114. FIG. 37 illustrates a cross-section G-G of the substrate 100 clamped on the substrate holder in Y-Z plane. As can be seen from this Figure the substrate is spaced from the surface of the substrate holder 100 by the metallisation pads 113 and 114. This spacing results in narrow channels 182 between the substrate and the substrate holder having a height in Z direction being equal to the thickness of the metallisation pads 113 and 114. The hole 120 is at least partially filled with the sacrificial material 100-2 in a liquid form as depicted in FIGS. 38 and 39, illustrating the same cross-sections as in FIGS. 36 and 37 but after the at least partially filling the hole 120 with the sacrificial material 100-2. The filling can be performed by inkjet printing. UV-curable and inkjet-compatible resists can be used for forming the sacrificial material, e.g. mr-UVCur26SF resist is commercially available from Micro Resist Technology GmbH. The viscosity and/or capillary forces acting on the liquid sacrificial material 100-2 can are optimized such that it does not flow through the channels 182. As alternative the portions of substrate being spaced apart from the substrate holder 180, in particular the portion having the width W2 and the portion having the width W3 (FIGS. 1 and 2), can be coated with a sacrificial planarizing material to close the channels 182. After the at least partially filling the hole 120 the liquid sacrificial material 100-2 is solidified by baking at elevated temperature or by ultraviolet (UV) light curing. The substrate 100 and the substrate holder 180 are separated after the solidification of the sacrificial material 100-2. In order to avoid adhesion of the sacrificial material 100-2 to the substrate holder 180 and thereby enable separation of the substrate 100 from the substrate holder 180 the portion of the substrate holder for being in contact with the sacrificial material 100-2 is made of chemically inert material like Polytetrafluoroethylene (PTFE), commercially available as Teflon*, or any other material to which the sacrificial material 100-2 does not adhere. As alternative the substrate holder can be coated by an anti-adhesive coating like PTFE-coating, fluoro-elastomer coating, polyethylene oxide (PEO)-coating, zwitterionic polymer coating, or Polyethylene oxide-polypropylene oxide-polyethylene oxide (PEO-PPO-PEO) amphiphilic triblock copolymer coating, commercially available as Pluronics®.

FIGS. 40-43 illustrate methods of manufacturing of the thermoelectric element employing p-n or p-i-n junction depicted in FIG. 8. Since these methods are based on the same steps as the methods depicted in FIGS. 19-35, the processing steps described above a mentioned by reference in the description of the methods depicted in FIGS. 40-43. The method begins with providing a dielectric substrate 100. In contrast to the methods described above, this substrate does not have metallisation pads. Afterwards, as option, a recess 120-1 and/or auxiliary recess 120-2 can be made. The purpose of these recesses and methods of their manufacturing are the same as described above (FIGS. 20 and 30). When the substrate 100 is provided with a hole 120 or the hole 120 is made in the provided substrate as described above, the hole 120 is filled at least partially with a sacrificial material, which is has the same purpose as in the methods described above (e.g., FIG. 22). This option is not depicted in FIGS. 40-43.

After providing the substrate without a hole 120, or after the at least partially filling the hole 120, or after making the recess 120-1 and/or 120-2, when either one or both of them are made, the first thermoelectric layer is formed on the first side of the substrate 100 as described above. The first thermoelectric layer 101 can be a single layer or comprise several layers as described above. The first thermoelectric layer 101 is depicted as an interface layer or portion 101-1 and a remote layer or portion 101-2 in FIGS. 41-43. The portions 101-1 and 101-2 can be portions of the same thermoelectric layer or can be different layers of the first thermoelectric layer 101 as described above. The layer or portion 101-1 is between the substrate 100 and the layer or portion 101-2 and the substrate. The first thermoelectric layer can have as an option a dopant concentration gradient as described above. In this case the average dopant concentration in the portion 101-1 is lower than an average dopant concentration in the portion 101-2. As yet another option the layer 101-1 is made of a thermoelectric material having lower charge carrier concentration than a thermoelectric material of the layer 101-2. The layer or portion 101-1 in FIGS. 41-43 corresponds to the layer or portion 101-1 in FIG. 8, whereas the layer or portion 101-2 in FIGS. 41-43 corresponds to the layer or portion 101-2 in FIG. 8.

After forming the first thermoelectric layer 101 the hole 120 is completed of the sacrificial material is removed from the hole 120 as described above (FIG. 42). After the completion of the hole 120 or after the removal of the sacrificial material from the hole 120 the second thermoelectric layer 120 is formed on the second side of the substrate as described above. The first thermoelectric layer 101 contacts the second thermoelectric layer 102 via the hole 120. The second thermoelectric layer 102 can be a single layer or comprise several layers as described above. The second thermoelectric layer 102 is depicted as an interface layer or portion 102-1 and a remote layer or portion 102-2 in FIG. 43. The portions 102-1 and 102-2 can be portions of the same thermoelectric layer or can be different layers of the second thermoelectric layer 102 as described above. The layer or portion 102-1 is between the substrate 100 and the layer or portion 102-2 and the substrate. The second thermoelectric layer can have as an option a dopant concentration gradient as described above. In this case the average dopant concentration in the portion 102-1 is lower than an average dopant concentration in the portion 102-2. As yet another option the layer 102-1 is made of a thermoelectric material having lower charge carrier concentration than a thermoelectric material of the layer 102-2. The layer or portion 102-1 in FIG. 43 corresponds to the layer or portion 102-1 in FIG. 8, whereas the layer or portion 102-2 in FIG. 43 corresponds to the layer or portion 102-2 in FIG. 43.

The thermoelectric layers 101 and 102 can be annealed as described above. The first and the second metallisation pads can be formed on the first thermoelectric layer 101 at any stage after its formation. The third and the fourth metallisation pads can be formed on the second thermoelectric layer 102 at any stage after its formation.

The first metallisation pad 111 depicted in FIGS. 41-43 can comprise as an option the interface layer 111-1 and the bulk metallisation layer 111-2, whereas the second metallisation pad 112 can comprise as an option the interface layer 112-1 and the bulk metallisation layer 112-2. The metallisation pads 111 and 112 can be formed by deposition of metallisation layer or layers with a subsequent structuring resulting in two separate metallisation pads 111 and 112. This can be made by laser ablation of a portion of the metallisation layer(s) above the hole. In addition to the functions mentioned above an interface layer before its structuring into the interface layers 111-1 and 112-1 can function as a source of drive-in dopants for the underlaying first thermoelectric layer 101 during its annealing. The drive-in of dopants enables manufacturing of the layer 101-2 in the first thermoelectric layer 101, which had uniform chemical composition before the drive-in of the dopant atoms. As alternative the drive-in of dopants enables altering of a chemical composition of the layer 101-2.

The third metallisation pad 113 depicted in FIG. 43 can comprise as an option the interface layer 113-1 and the bulk metallisation layer 113-2, whereas the fourth metallisation pad 114 can comprise as an option the interface layer 114-1 and the bulk metallisation layer 114-2. The metallisation pads 113 and 114 can be formed by deposition of metallisation layer or layers with a subsequent structuring resulting in two separate metallisation pads 113 and 114. This can be made by laser ablation of a portion of the metallisation layer(s) above the hole. In addition to the functions mentioned above an interface layer before its structuring into interface layers 113-1 and 114-1 can function as a source of drive-in dopants for the underlaying second thermoelectric layer 102 during its annealing. The drive-in of dopants enables manufacturing of the layer 102-2 in the second thermoelectric layer 102, which had uniform chemical composition before the drive-in of the dopant atoms. As alternative the drive-in of dopants enables altering of a chemical composition of the layer 102-2.

The structuring of the metallisation layers and the thermoelectric layers described herein can be also performed by etching via resist or photoresist masks as it is customary in the semiconductor industry.

FURTHER ASPECTS AND APPLICATIONS

The thermoelectric elements and generators described in the previous chapter can be used as Peltier coolers. In this case a voltage is applied to a p-n or p-i-n junction of the thermoelectric element or a series of the p-n or p-i-n junctions of these elements such that the p-n or p-i-n junction(s) is(are) reverse biased. The same thermoelectric layers can be used in such a Peltier cooler. In addition, semiconductor layers of different conductivity types can be used instead of the first and the second thermoelectric layers when the element is used as a Peltier cooler. For instance, a semiconductor layer having p-type conductivity can be used instead of the first thermoelectric layer and a semiconductor layer having n-type conductivity can be used instead of the second thermoelectric layer, whereas the same dielectric substrate and metallisation pads as described above can be used in this Peltier cooler. A voltage for reverse biasing the p-n or p-i-n junction can be applied to the first and the third metallisation pads, whereas at least one of the second and the fourth metallisation pads can be thermally coupled to a component to be cooled. The fifth metallisation pad can be used instead of the first metallisation pad for the reverse biasing of the p-n or p-i-n junction, when the fifth metallisation pad is implemented. The sixth metallisation pad can be used for thermal coupling to the component to be cooled, when the sixth metallisation pad is implemented. At least one of the first, the third, and the fifth metallisation pads can be used for thermal coupling to a heat dissipation element.

As mentioned in the previous chapter, the hole 120 in the dielectric substrate 100 between the first and the second metallisation pads 111 and 112 provides for the reduction of the parasitic heat flow via the dielectric substrate 100. The hole 120 and the first and the second metallisation pads 111 and 112 can any of the shapes described in the previous chapter. A performance of a thermoelectric element employing only one thermoelectric layer can be improved in the same way. Such an element can be the element depicted in FIG. 1 or 2, wherein the second thermoelectric layer 102 is absent. The absence of the second thermoelectric layer makes redundant respective metallisation pads 113 and 114 being in direct contact with this layer. A cross-section of such a thermoelectric element is depicted in FIG. 44. It comprises the dielectric substrate 100 having the first and the second metallisation pads 111 and 112 on its first side. The substrate has the hole 120 between the first and the second metallisation pads. The thermoelectric element comprises only one thermoelectric layer 101. The thermoelectric layer 101 covers the hole 120 and is in direct contact with the first 111 and the second 112 metallisation pads. The thermoelectric element may comprise the optional fifth metallisation pad 115 on its second side. The fifth metallisation pad is thermally and electrically connected to the first metallisation pad via the metal via 117. The thermoelectric element may comprise the optional sixth metallisation 116 pad on its second side. The sixth metallisation pad is thermally and electrically connected to the second metallisation pad via the metal via 118. The shapes and/or arrangements of any of the elements 100, 101, 111, 112, 115, 116, 117, and 118 may be the same as described in the previous chapter. The dielectric substrate 100 may have a recess 120-2 on its second side instead of hole (FIG. 45). The recess is positioned below a fragment of the thermoelectric layer between the first and the second metallisation pads, i.e. below a gap between the first and the second metallisation pads 111 and 112. Thereby, the recess provides for the same technical effect as the hole, i.e. it mitigates the parasitic heat flow via the dielectric substrate. In contrast to the hole 120 the recess 120-2 in FIG. 45 may extend over entire width W1 (FIGS. 1 and 2) of the dielectric substrate. The gap between the first metallisation pad and the second metallisation pad, the gap be a slit having one of the following shapes: a rectangular slit, a meander-shaped slit, a sawtooth-shaped slit, or a wave-shaped slit.

The first metallisation pad 111 and/or the fifth metallisation pad 115 can be arranged for thermal coupling to a heat sink. The second metallisation pad 112 and/or the sixth metallisation pad 116 can be arranged for thermal coupling to a heat source. The voltage generated by the thermoelectric element can be tapped from the first 111 and the second 112 metallisation pads. The fifth metallisation pad can be used instead of or in addition to the first metallisation pad for the electrical connection. The sixth metallisation pad can be used instead of or in addition to the second metallisation pad for electrical the connection.

Two types of this thermoelectric element are required for building a thermoelectric generator. The thermoelectric element of one type comprises only the first thermoelectric layer having one conductivity type, whereas the thermoelectric element of another type comprises only the second thermoelectric layer having another conductivity type.

These thermoelectric elements can be arranged electrically in series in a thermoelectric generator such that an alternating series of the thermoelectric layer conductivity types is built, wherein the thermoelectric layers of different conductivity type are alternated in the series. As a result, a voltage generated by the series of the thermoelectric elements is a sum of voltages generated by the individual thermoelectric elements. The serial electrical connection of the thermoelectric elements can be implemented using the metallisation pads arranged for thermal coupling to a heat sink and the metallisation pads arranged for thermal coupling to a heat source. For instance, a thermoelectric element has its first metallisation pad electrically connected to a first metallisation pad of a thermoelectric element being in series immediately before said thermoelectric element, and its second metallisation pad electrically connected to a second metallisation pad of a thermoelectric element being in series immediately after said thermoelectric element, wherein said first metallisation pads are arranged for thermal coupling to a heat source and said second metallisation pads are arranged for thermal coupling to a heat sink, wherein said thermoelectric element comprises a thermoelectric layer having one conductivity type and said adjacent thermoelectric elements each comprise a thermoelectric layer having another conductivity type. The electrical connections between pairs of the first metallisation pads and pairs of the second metallisation pads is implemented using only metallic conductors. A voltage generated by the thermoelectric generator in operation can be tapped from a first metallisation pad of a first in series thermoelectric element and a second metallisation pad of a thermoelectric element being the last in series, wherein second metallisation pads of the first in series thermoelectric element and a second in series thermoelectric element are electrically connected together, wherein first metallisation pads of a penultimate in series thermoelectric element and the last in series thermoelectric element are electrically connected together. As mentioned above, the fifth metallisation pads can be used instead of or in addition to the first metallisation pads for electrical connections and/or thermal coupling to the heat source. The sixth metallisation pads can be used instead of or in addition to the second metallisation pads for electrical connections and/or thermal coupling to the heat sink.

The electrical connections between the thermoelectric elements employing single thermoelectric elements can be implemented using interconnect elements as described in the previous chapter. Pairs of the first metallisation pads (or the fifth metallisation pads) can be electrically connected by metallisation pads on a dielectric substrate of an interconnect element in a similar way as the interconnect element 160 provides electrical connections between the pairs of the first and the third metallisation pads in FIG. 14. Pairs of the second metallisation pads (or the sixth metallisation pads) can be electrically connected by metallisation pads on a dielectric substrate of another interconnect element in a similar way as the interconnect element 170 provides electrical connections between the pairs of the first and the third metallisation pads in FIG. 14.

This thermoelectric generator is manufactured by electrically connecting the first metallisation pads (or the fifth metallisation pads) of adjacent in series thermoelectric elements and electrically connecting the second metallisation pads (or the sixth metallisation pads) of adjacent in series thermoelectric elements such that the alternating conductivity type series of the thermoelectric layers is built. The electrical connections are made using the soldering process or the brazing process as described above.

The thermoelectric elements employing single thermoelectric layers and the thermoelectric generator employing these thermoelectric elements can be used as coolers. In this case metallisation pads used for tapping the generated thermoelectric voltage are used for connecting a current or a voltage source.

FIG. 46 illustrates an initial step of a manufacturing process of the thermoelectric element employing a single thermoelectric layer. At this step the dielectric substrate 100 with the first and the second metallisation pads 111 and 112 on its first side is provided. The first 111-1, 111-2 metallisation and the second 112-1, 112-2 pads may have coatings 111-1 and 112-1 having the same functionalities as described in the previous chapter. In particular the coatings 111-1 and 112-1 can function as a diffusion barrier layer preventing atoms of the metallisation pads diffusing into the thermoelectric layer, a work function setting material layer, a layer for reduction electrical and/or thermal contact resistance between a thermoelectric layer and a metallisation pad. Preferably the interface layer is a metallic layer. The dielectric substrate 100 may have as option the recess 120-2 on its second side. The recess 120-2 is positioned below the gap separating the first and the second metallisation pads 111 and 112. The fifth metallisation pad 115 may be arranged as option on the second side of the dielectric substrate. The fifth metallisation pad 115 is thermally and electrically coupled to the first metallisation pad 111, e.g. via the metal via 117. The sixth metallisation pad 116 may be arranged as option on the second side of the dielectric substrate. The sixth metallisation pad 116 is thermally and electrically coupled to the second metallisation pad 112, e.g. via a metal via 118.

In the next step a thermoelectric layer 111 is formed on the first side of the dielectric substrate. The forming of the thermoelectric layer may include not only deposition of a material of the thermoelectric layer but its annealing and/or structuring as described in the process step of the forming of the first thermoelectric layer in the previous chapter (FIG. 23). An example result of this process step is depicted in FIG. 45, wherein the dielectric substrate 100 initially has the recess 120-2 and the thermoelectric layer is not structured. The recess 120-2 can be further deepened after the formation of the thermoelectric layer 111. The hole 120 is built, if the recess 120-2 is deepened up to a bottom of the thermoelectric layer 101. The thermoelectric element obtained in this case process is depicted in FIG. 44. In case the recess 120-2 was absent before the formation of the thermoelectric layer it can be made afterwards. The thermoelectric element obtained in this case is depicted in FIG. 45. As another option, when the recess 120-2 was absent before the formation of the thermoelectric layer, entire hole 120 can be made after the formation of the thermoelectric layer 101. The thermoelectric element obtained in this case is depicted in FIG. 44. The structuring of the dielectric substrate 100, in particular the building of the recess 120-2 and the hole 120, can be performed by the laser ablation or by a combination of the laser ablation and the ion beam etching as described in the previous chapter.

Substrate structuring provides for another opportunity for engineering of interfaces between the thermoelectric layer 101 and the first 111 and the second 112 metallisation pads. FIGS. 46-52 illustrate method steps and manufactured thermoelectric elements. The method may begin with providing the dielectric substrate 100 having the first and the second metallisation pads 111 and 112 on its first side (FIG. 46). The metallisation pads 111 and 112 are separated by a gap. An optional recess 120-2 can be made under the gap before or after forming layers on the first side. The substrate 100 can have as an option the fifth and/or the sixth metallisation pads 115 and 116 as described above.

After providing the dielectric substrate or after making the recess 120-2, an interface layer 112-3 and a thermoelectric layer 101 are formed (FIGS. 47 and 48), wherein the thermoelectric layer 101 is in direct contact with interface layer 112-3 and interface layer is in direct contact with the first and the second metallisation pads 111 and 112. An interface material layer 112-3 and the thermoelectric layer are deposited in dedicated vacuum deposition processes (e.g., physical deposition process (PVD) or CVD) without breaking vacuum. The deposition of the interface layer may comprise deposition of different layers each serving a specific purpose. The interface layer can serve one or more of the following purposes mentioned in the previous chapter: a diffusion barrier layer preventing atoms of the metallisation pads diffusing into the thermoelectric layer (e.g. a transition metal nitride layer, preferably one or more of titanium nitride, zirconium nitride, titanium nitride, hafnium nitride, or tantalum nitride), a work function setting material layer (a layer of platinum-antimony alloy or gold-antimony alloy, when the thermoelectric element is a Peltier cooling element), a layer for reduction electrical and/or thermal contact resistance between a thermoelectric layer and a metallisation pad. Preferably the interface layer is a metallic layer. Deposition of each of the layers of the interface layer 112-2 can be performed in dedicated vacuum deposition processes (e.g. CVD or PVD) without breaking vacuum. The metallisation pads 111 and 112 can be cleaned in another process prior to deposition of the interface layer 112-3. The cleaning can be performed by plasma of ion beam. Preferably the deposition of the interface layer is performed after the cleaning of the metallisation pads 111 and 112 without breaking vacuum.

It might be advantageous to deposit the interface layer (or a plurality of layers constituting the interface layer) and the thermoelectric layer without breaking vacuum, e.g. in a cluster PVD and/or CVD tool equipped with deposition chambers for deposition of specific materials. For instance, the interface layer (or the plurality of layers constituting the interface layer) and the thermoelectric layer can be deposited in dedicated vacuum deposition processes like sputtering without breaking vacuum between these processes. Such an approach may result in a formation of a contamination-free interface between the thermoelectric layer 101 and the interface layer 112-3. High quality interfaces can be of advantage for controlling the Fermi-level pinning effect induced by interface states at the interface. A contamination free interface can be an interface which has a negligible concentration of foreign atoms (e.g., less than 0.1 at %, preferably less than 0.01 at %, more preferably less than 0.001 at %) at the interface which do not belong to the materials of layers constituting the interface. The concentration of atoms may be defined in a volume which borders are at a short distance from each side of the interface, e.g. one border of the volume can be at distance of 3 nm, preferably 2 nm, from the interface in one direction whereas another border of the volume can be at a distance of 3 nm, preferably 2 nm, from the interface in an opposite direction.

After the deposition of the interface layer 112-3 (or a plurality of layers constituting the interface layer) and the thermoelectric layer 101 without breaking vacuum, the interface layer 112-3 is structured or the hole 120 is made or completed starting from the recess 120-2 (FIG. 49) as described in the previous chapter. The hole may be a slit having one of the following shapes: a rectangular slit, a meander-shaped slit, a sawtooth-shaped slit, or a wave-shaped slit as described above, in particular with reference to the description of FIGS. 9-12. The hole 120 has a first opening on the first side between the first 111 and the second 112 metallisation pads and a second opening on a second side of the dielectric substrate 100. The first opening is covered by the interface layer 112-3 (FIG. 49). The structuring of the interface layer 112-3 comprises removing the following of its fragments galvanically connecting the first and the second metallisation pads: a first fragment on the dielectric substrate portion having the width W2 (FIGS. 1 and 2), a second fragment on the dielectric substrate portion having the width W3 (FIGS. 1 and 2), and a third fragment covering a first opening of the hole on the first side of the dielectric substrate. The first and the second fragments of the interface layer and respective fragments of the thermoelectric layer above them can be removed by laser ablation, preferably by photoablation, The third fragment of the interface layer can be removed by the ion beam etching via the hole 120.

FIGS. 50-52 illustrate another method for manufacturing a thermoelectric element employing a single thermoelectric layer. The characteristic features of this method are summarised in clauses 25-36. The method begins with providing the dielectric substrate 100 with the first 111 and the second 112 metallisation pads separated by a gap. The substrate 100 can have as an option the fifth and/or the sixth metallisation pads 115 and 116 as described above. The substrate may have a hole 120 or this hole 120 is made as described in the previous chapter. At this manufacturing stage, the product differs from the thermoelectric elements depicted in FIGS. 1 and 2 in that the third 113 and the fourth 114 metallisation pads and the first 101 and the second 102 thermoelectric layers are missing.

Afterwards the gap between the first and the second metallisation pads 111 and 112 is filled with a sacrificial material 100-2. The hole 120 can be at least partially filled with the sacrificial material as well. Filling the gap between the metallisation pads 101 and 102 with the sacrificial material 100-2 may substantially mitigate or eliminate difficulties caused by the aforementioned step-coverage problem. The sacrificial material can be arranged such that its surface is coplanar with the surfaces of the first and the second metallisation pads 111 and 112. In other words, the surface of the sacrificial material and the surfaces of the first and the second metallisation pads are in the same X-Y plane as depicted in FIG. 50. The sacrificial material can be formed as described in a method illustrated in FIGS. 36-39. As can be clearly seen from FIG. 38, a bottom surface of the sacrificial material 100-2 is coplanar with the bottom surfaces of the third and the fourth metallisation pads 113 and 114.

After the forming the sacrificial material 100-2 the interface layer (or a plurality of interface layers constituting the interface layer) 112-3 and the thermoelectric layer 101 are deposited and structured as described above (FIG. 51). The interface layer is in direct contact with the sacrificial material 100-2 and the first and second metallisation pads 111 and 112, whereas the thermoelectric layer 100 is in direct contact with the interface layer 112-3. As described above the interface layer 112-3 can comprise a plurality of layers each deposited in a dedicated vacuum deposition process (e.g., PVD or CVD) without breaking vacuum between these processes. The thermoelectric layer 101 can be deposed in a dedicated vacuum deposition process (e.g. PVD or CVD) after the deposition of the interface layer 112-3 without breaking the vacuum. The interface layer 112-3 serves the same purposes and/or has the same functionalities as described above. For instance, the interface layer 112-3 can be a transition metal nitride layer having one side in direct contact with the metallisation pad 111 or 112 and another side in direct contact with the thermoelectric layer. Such a layer functions as a diffusion barrier preventing atoms of the metallisation pad diffusing into the thermoelectric layer. The interface layer can further comprise another layer, e.g. a work function setting material layer. This layer is positioned in direct contact with the thermoelectric layer and positioned between the diffusion barrier layer and the thermoelectric layer. The work function setting material is platinum-antimony or gold-antimony alloy, when the thermoelectric element is a Peltier cooling element.

Afterwards, the first, second and the third fragments of the interface layer 112-3 are removed as described above, to remove galvanic connection between the metallisation pads via the interface layer 112-3. To enable the etching of the third fragment of the interface layer covering the first opening of the hole 120 the sacrificial material is removed from the gap and, when necessary, from hole 120 using the process described in the previous chapter (FIG. 52). As a result of this process the thermoelectric element specified in clauses 40-48 is built. In particular, this method enables forming the planar thermoelectric layer 101 being in direct contact with the first 111 and the second 112 metallisation pads, i.e. no step coverage issues. Moreover the method enables making contamination-free interfaces between the planar thermoelectric layer 101 and the metallisation pads 111 and 112.

The thermoelectric generator constructed using the thermoelectric elements employing single thermoelectric layers can be used as a Peltier cooler. The first and the second metallisation pads used for tapping off the generated electrical power are used in this case as terminals for sending current via the thermoelectric layers.

Although the present invention has been described with reference to preferred embodiments, workers skilled in the art will recognize that changes may be made in form and detail without departing from the scope of the invention.

In Summary, the Invention May be Described by the Following Clauses

Clause 1. A thermoelectric element (10; 20), comprising:
a dielectric substrate (100) having a hole (120), wherein the hole has a first opening on a first side of the dielectric substrate and a second opening on a second side of the dielectric substrate;
a first metallisation pad (111; 111-1, 111-2) and a second metallisation pad (112; 112-1, 112-2) on the first side, wherein the first opening is between the first metallisation pad and the second metallisation pad;
a third metallisation pad (113; 113-1, 113-2) and a fourth metallisation pad (114; 114-1, 114-2) on the second side, wherein the second opening is between the third metallisation pad and the fourth metallisation pad;
a first thermoelectric layer (101; 101-1, 101-2) being in direct contact with the first metallisation pad and the second metallisation pad;
a second thermoelectric layer (102; 102-1, 102-2) being in direct contact with the third metallisation pad and the fourth metallisation pad, wherein the first thermoelectric layer and the second thermoelectric layer have different conductivity types, contact with each other via the hole and thereby build a p-n or p-i-n junction.

Clause 2. A thermoelectric element (30), comprising: a dielectric substrate (100) having a hole (120), wherein the hole has a first opening on a first side of the dielectric substrate and a second opening on a second side of the dielectric substrate;
a first thermoelectric layer (101; 101-1, 101-2) on the first side;
a second thermoelectric layer (102; 102-1, 102-2) on the second side, wherein the first thermoelectric layer and the second thermoelectric layer have different conductivity types, contact with each other via the hole and thereby build a p-n or p-i-n junction;

a first metallisation pad (111; 111-1, 111-2) and a second metallisation pad (112; 112-1, 112-2)each being in direct contact with the first thermoelectric layer on a respective opposite side of the first opening;

a third metallisation pad (113; 113-1, 114-1) and a fourth metallisation pad (114; 114-1, 114-2) each being in direct contact with the second thermoelectric layer on a respective opposite of the second opening.

Clause 3. The thermoelectric element of clause 1 or 2, comprising a fifth (115; 116) metallisation pad on the second side, wherein the fifth metallisation pad is thermally and electrically coupled to the first metallisation pad (111) or the second metallisation pad (112).

Clause 4. The thermoelectric element of clause 1 or 3 without reference to clause 2, wherein the first metallisation pad has a first sidewall facing a second sidewall of the second metallisation pad, wherein the first sidewall and the second sidewall are separated by the first opening, wherein the first sidewall and/or the second sidewall are tapered and/or wherein a contour of the first sidewall on the first side and/or a contour of the second sidewall of the first side are spaced from the first opening.

Clause 5. The thermoelectric element of any of the preceding clauses, wherein the hole is tapered outwards from the interface (110) between the first thermoelectric layer and the second thermoelectric layer as a distance from the interface increases.

Clause 6. The thermoelectric element of any of the preceding clauses, wherein a dopant concentration in the first thermoelectric layer increases in a direction from the interface (110) preferably this direction is perpendicular to the plane of the interface (110).

Clause 7. The thermoelectric element of any of the preceding clauses, wherein a dopant concentration in the second thermoelectric layer increases in a direction from the interface (110) preferably this direction is perpendicular to the plane of the interface (110).

Clause 8. The thermoelectric element of any of the preceding clauses, wherein the first thermoelectric layer comprises a first portion (101-1) adjacent to the interface (110) and a second portion (101-2) adjacent to the first portion (101-1) and the first (111, 111-1, 111-2) and the second (112; 112-1, 112-2) metallisation pad (FIG. 7), wherein the first portion (101-1) has lower dopant concentration averaged over volume than the second portion (101-2) or the first portion (101-1) is made of one or more thermoelectric materials each having lower charge carrier concentration than each of one or more thermoelectric materials used for manufacturing of the second portion (101-2).

Clause 8A. The thermoelectric element of any of the preceding clauses, wherein the second thermoelectric layer comprises a first portion (102-1) adjacent to the interface (110) and a second portion (102-2) adjacent to the first portion (102-1) and the third (113, 113-1, 113-2) and the fourth (114; 114-1, 114-2) metallisation pad (FIG. 7), wherein the first portion (102-1) has lower dopant concentration averaged over volume than the second portion (102-2) or the first portion (102-1) is made of one or more thermoelectric materials each having lower charge carrier concentration than each of one or more thermoelectric materials used for manufacturing of the second portion (102-2).

Clause 9. The thermoelectric element of any of the preceding clauses, wherein the first metallisation pad and the third metallisation pad are arranged for thermal coupling to a heat sink, wherein the second metallisation pad and the fourth metallisation pad are arranged for thermal coupling to a heat source, wherein a voltage generated by the thermoelectric element, when the latter is in operation, is tapped from the first metallisation pad and the third metallisation pad.

Clause 10. The thermoelectric element of any of the preceding clauses, wherein the hole is a slit having one of the following shapes: a rectangular slit (120*a*), a meander-shaped slit (120*b*), a sawtooth-shaped slit (120*c*), or a wave-shaped slit (120*d*); and/or wherein a material of the first thermoelectric layer has a lower thermal and/or electrical conductivity than a material of the second thermoelectric layer, wherein the interface (110) between the first thermoelectric layer and the second thermoelectric layer is positioned closer to first side than to the second side of the dielectric substrate and/or the first thermoelectric layer is thicker than the second thermoelectric layer.

Clause 11. A thermoelectric generator (130; 230), comprising thermoelectric elements of any of the preceding clauses, wherein the first metallisation pads and the third metallisation pads are electrically connected in series such that an alternating series of the first and the second thermoelectric layers is built.

Clause 12. A method for manufacturing a thermoelectric element (10;20), the method comprising:

forming a first thermoelectric layer (101; 101-1, 101-2) on a first side of a dielectric substrate (100) having a first metallisation pad (111; 111-1, 111-2) and a second metallisation pad (112; 112-1, 112-2) on its first side, wherein the first metallisation pad and the second metallisation pad are separated by a gap, wherein the first thermoelectric layer is formed in the gap on the first side and in direct contact with the first metallisation pad and the second metallisation pad;

building a hole (120) in the dielectric substrate having a second opening between a third metallisation pad (113; 113-1, 113-2) and a fourth metallisation pad (114, 114-1, 114-2) on a second side of the dielectric substrate, wherein a first opening of the hole is covered by the first thermoelectric layer in the gap; and forming a second thermoelectric layer (102; 102-1, 102-2) on the second side of the dielectric substrate, wherein the second thermoelectric layer is formed in the hole such that it contacts directly the first thermoelectric layer thereby building a p-n or p-i-n junction, wherein the second thermoelectric layer is in direct contact with the third metallisation pad and the fourth metallisation pad.

Clause 13. The method of clause 12, comprising building a recess (120*b*) in the dielectric substrate in the gap before the forming of the first thermoelectric layer.

Clause 14. A method for manufacturing a thermoelectric element (10;20), the method comprising:

at least partially filling a hole (120) of a dielectric substrate (100) with a sacrificial material (100-2), wherein the hole has a first opening on a first side of the dielectric substrate and a second opening on a second side of the dielectric substrate, wherein a first metallisation pad (111; 111-1, 111-2) and a second metallisation pad (112; 112-1, 112-2) are arranged the first side, wherein the first opening is between the first metallisation pad and the second metallisation pad, wherein a third metallisation pad (113; 113-1, 113-2) and a fourth metallisation pad (114; 114-1, 114-2) are arranged on the second side, wherein the second opening is between the third metallisation pad and the fourth metallisation pad;

forming a first thermoelectric layer (101; 101-1, 101-2) on the sacrificial material and in direct contact with the first metallisation pad (111; 111-1, 111-2) and the second metallisation pad (112; 112-1, 112-2);

removing the sacrificial material; and forming a second thermoelectric layer (102; 102-1, 102-2) on the second side of the dielectric substrate, wherein the second thermoelectric layer is formed in the hole such that it contacts directly the first thermoelectric layer thereby building a p-n or p-i-n junction, wherein the second thermoelectric layer is in direct contact with the third metallisation pad and the fourth metallisation pad.

Clause 15. A method for manufacturing a thermoelectric element (30), the method comprising:

at least partially filling a hole (120) of a dielectric substrate (100) with a sacrificial material (100-2), wherein the hole has a first opening on a first side of the dielectric substrate and a second opening on a second side of the dielectric substrate, forming a first thermoelectric layer (101; 101-1, 101-2) on the sacrificial material and the first side;

removing the sacrificial material;

forming a second thermoelectric layer (102; 102-1, 102-2) on the second side of the dielectric substrate, wherein the second thermoelectric layer is formed in the hole such that it contacts directly the first thermoelectric layer thereby building a p-n or p-i-n junction;

forming a first metallisation pad (111; 111-1, 111-2) and a second metallisation pad (112; 112-1, 112-2) each being in direct contact with the first thermoelectric layer on a respective opposite side of the first opening; and forming a third metallisation pad (113; 113-1, 113-2) and a fourth metallisation pad (114; 114-1, 114-2) each being in direct contact with the second thermoelectric layer on a respective opposite side of the second opening.

Clause 16. A method for manufacturing a thermoelectric element (30), the method comprising:

forming a first thermoelectric layer (101; 101-1, 101-2) on a first side of a dielectric substrate (100);

building a hole (120) in the dielectric substrate, wherein the hole has a first opening on the first side and a second opening of a second side of the dielectric substrate, wherein the first opening is covered by the first thermoelectric layer;

forming a second thermoelectric layer (102; 102-1, 102-2) on the second side, wherein the second thermoelectric layer is formed in the hole such that it contacts directly the first thermoelectric layer thereby building a p-n or p-i-n junction;

forming a first metallisation pad (111; 111-1, 111-2) and a second metallisation pad (112; 112-1, 112-2) each being in direct contact with the first thermoelectric layer on a respective opposite side of the first opening; and forming a third metallisation pad (113; 113-1, 113-2) and a fourth metallisation pad (114; 114-1, 114-2) each being in direct contact with the second thermoelectric layer on a respective opposite side of the second opening.

Clause 17. The method of any of clauses 12 through 16, wherein the forming of the first thermoelectric layer comprises forming a first portion (101-1) of the first thermoelectric layer and a second portion (101-2) of the first thermoelectric layer, wherein the first portion (101-1) is adjacent to the interface (110) between the first (101) and the second (102) thermoelectric layer and the second portion (101-2) is adjacent to the first portion and the first (111) and the second (112) metallisation pad, wherein the first portion (101-1) has lower dopant concentration averaged over volume than the second portion (101-2) or the first portion (101-1) is made of one or more thermoelectric materials each having lower charge carrier concentration than each of one or more thermoelectric materials used for manufacturing of the second portion (101-2).

Clause 19. The method of any of clauses 12 through 17, wherein the forming of the second thermoelectric layer comprises forming a first portion (102-1) of the second thermoelectric layer and a second portion (102-2) of the second thermoelectric layer, wherein the first portion (102-1) is adjacent to the interface (110) between the first (101) and the second (102) thermoelectric layer and the second portion (102-2) is adjacent to the first portion and the third (113) and the fourth (114) metallisation pad, wherein the first portion (102-1) has lower dopant concentration averaged over volume than the second portion (102-2) or the first portion (102-1) is made of one or more thermoelectric materials each having lower charge carrier concentration than each of one or more thermoelectric materials used for manufacturing of the second portion (102-2).

Clause 20. A method for manufacturing of a thermoelectric generator (130; 230), the method comprising electrically connecting the first metallisation pads and the third metallisation pads of the thermoelectric elements of any of clauses 1 through 10 such that an alternating series of the first and the second thermoelectric layers is built.

Clause 21. A method for manufacturing a thermoelectric element, the method comprising:

forming a thermoelectric layer (101) on a first side of a dielectric substrate (100) having a first metallisation pad (111; 111-1, 111-2) and a second metallisation pad (112; 112-1, 112-2) on its first side, wherein the first metallisation pad and the second metallisation pad are separated by a gap, wherein the thermoelectric layer is formed in the gap on the first side and in direct contact with the first metallisation pad and the second metallisation pad.

Clause 22. The method of clause 21, comprising: making (120-2) a recess in the dielectric substrate (100) on its second side below the gap.

Clause 23. A method for manufacturing a thermoelectric element, the method comprising:

providing a dielectric substrate having (100) a hole (120), wherein the hole has a first opening on a first side of the dielectric substrate and a second opening on a second side of the dielectric substrate, wherein a first metallisation pad (111; 111-1, 111-2) and a second metallisation pad (112; 112-1, 112-2) are arranged on the first side, wherein the first opening is between the first metallisation pad and the second metallisation pad;

filling a gap between the first metallisation pad and the second metallisation pad with a sacrificial material (100-2);

forming a thermoelectric layer (101) in direct contact with the sacrificial material, the first metallisation pad, and the second metallisation pad; and removing the sacrificial material after forming the thermoelectric layer.

Clause 24. A method for manufacturing a thermoelectric element, the method comprising:

forming an interface layer (112-3) on a first side of a dielectric substrate (100) having a first metallisation pad (111; 111-1, 111-2) and a second metallisation pad (112; 112-1, 112-2) on its first side, wherein the interface layer is direct contact with the first and the second metallisation pads;

forming a thermoelectric layer (101) on the interface layer above the first and the second metallisation pads and above a gap between the first and second metallisation pads;

building a hole (120) in the dielectric substrate having a second opening on a second side of the dielectric substrate, wherein a first opening of the hole is between the first and the second metallisation pads and covered by the interface layer in the gap between the first and the second metallisation pads;

etching, via the hole, a fragment of the interface layer covering the thermoelectric layer in the first opening.

Clause 25. A method for manufacturing a thermoelectric element (40), the method comprising:

providing a dielectric substrate (100) having a hole (120), wherein the hole has a first opening on a first side of the dielectric substrate and a second opening on a second side of the dielectric substrate, wherein a first metallisation pad (111; 111-1, 111-2) and a second metallisation pad (112; 112-1, 112-2) are arranged on the first side, wherein the first opening is between the first metallisation pad and the second metallisation pad;

filling a gap between the first metallisation pad and the second metallisation pad with a sacrificial material (100-2);

forming an interface layer (112-3) in direct contact with the sacrificial material, the first metallisation pad, and the second metallisation pad;

forming a thermoelectric layer (100) in direct contact with the interface material above the sacrificial material, the first metallisation pad, and the second metallisation pad;

removing the sacrificial material after forming the thermoelectric layer; and etching, via the hole, a fragment of the interface layer covering the thermoelectric layer in the first opening.

Clause 26. The method of clause 25, wherein a surface of the sacrificial material is coplanar with surfaces of the first and the second metallisation pads.

Clause 27. The method of any one of clauses 24 through 26, wherein the interface layer is a metallic layer.

Clause 28. The method of any of clauses 24 through 27, wherein the forming the interface layer comprises depositing the interface layer in a first vacuum deposition process and the forming the thermoelectric layer comprises depositing the thermoelectric layer in a second vacuum deposition process, wherein the first and the second deposition processes are performed without breaking vacuum.

Clause 29. The method of clause 28, further comprising: cleaning surfaces of the first and the second metallisation pads by plasma or ion beam in a cleaning process prior to the deposition of the interface layer, wherein the cleaning process and the first deposition processes are performed without breaking vacuum.

Clause 30. The method of any one of clauses 24 through 29, wherein the direct contact between the interface layer and the thermoelectric layer is constituted by a contamination-free interface.

Clause 31. The method of any one of clauses 24 through 30, wherein the interface layer comprises a work function setting material layer being in direct contact with the thermoelectric layer.

Clause 32. The method of clause 31, wherein the work function setting material is platinum-antimony or gold-antimony alloy, when the thermoelectric element is a Peltier cooling element.

Clause 33. The method of any one of the clauses 24 through 32, wherein the interface layer comprises a diffusion barrier material layer being in direct contact with the first and the second metallisation pad.

Clause 34. The method of clause 33, wherein the diffusion barrier material is a transition metal nitride.

Clause 35. The method of clause 34, wherein the transition metal nitride comprises one or more of: titanium nitride, zirconium nitride, titanium nitride, hafnium nitride, or tantalum nitride.

Clause 36. The method of any one of clauses 21 through 35, wherein the gap is a slit having one of the following shapes: a rectangular slit (120a), a meander-shaped slit (120b), a sawtooth-shaped slit (120c), or a wave-shaped slit (120d).

Clause 37. A thermoelectric element, comprising:

a dielectric substrate (100) having a first metallisation pad (111; 111-1, 111-2) and a second metallisation pad (112; 112-1, 112-2) on its first side, wherein the first metallisation pad and the second metallisation pad are separated by a gap; and a first thermoelectric layer (101) in the gap and in direct contact with the first metallisation pad and the second metallisation pad.

Clause 38. The thermoelectric element of clause 37, further comprising:

a recess (120-2) in the dielectric substrate (100) on its second side below the gap.

Clause 39. The thermoelectric element of clause 37, further comprising:

a hole (120) in the dielectric substrate, wherein the hole has a second opening on a second side of the wafer and a first opening between the first and the second metallisation pads, wherein the first opening is covered by the thermoelectric layer in the gap.

Clause 40. A thermoelectric element, comprising:

a dielectric substrate (100) having a hole (120), wherein the hole has a first opening on a first side of the dielectric substrate and a second opening on a second side of the dielectric substrate;

a first metallisation pad (111; 111-1, 111-2) and a second metallisation pad (112; 112-1, 112-2) on the first side, wherein the first opening is between the first metallisation pad and the second metallisation pad;

a planar thermoelectric layer (101) above the hole, wherein the planar thermoelectric layer has an interface with the first metallisation pad and an interface with the second metallisation pad, wherein both interfaces are in the same plane.

Clause 41. Thermoelectric element of clause 40, wherein the interfaces are contamination-free interfaces and/or above the first side of the dielectric substrate.

Clause 42. Thermoelectric element of clauses 37 through 41, wherein the first and the second metallisation pads each comprise a work function stetting material layer being in direct contact with the thermoelectric layer at the respective interface.

Clause 43. Thermoelectric element of clause 42, wherein the first and the second metallisation pad each comprise a diffusion barrier material layer underneath the respective work function setting material layer.

Clause 44. Thermoelectric element of clauses 37 through 41, wherein the first and the second metallisation pads each comprise a diffusion barrier material layer being in direct contact with the thermoelectric layer at the respective interface.

Clause 45. The thermoelectric element of clauses 37 through 44, comprising a third metallisation pad (115;116) on the second side, wherein the third metallisation pad is thermally and electrically coupled to the first metallisation pad or the second metallisation pad.

Clause 46. The thermoelectric element of clauses 37 through 45, wherein the first metallisation pad is arranged for thermal coupling to a heat sink, wherein the second metallisation pad is arranged for thermal coupling to a heat source.

Clause 47. The thermoelectric element of clauses 37 through 46, wherein the thermoelectric layer has p-type conductivity.

Clause 48. The thermoelectric element of clauses 37 through 46, wherein the thermoelectric layer has n-type conductivity.

Clause 49. A thermoelectric generator, comprising thermoelectric elements of any one of clauses 37 through 46 with reference to clause 47 and thermoelectric elements of any one of the clauses 37 through 46 with reference to clause 48, wherein the first metallisation pads and the second metallisation pads are electrically connected in series such that an alternating series of the planar thermoelectric layers having n-type conductivity and the planar thermoelectric layers having p-type conductivity is built.

Clause 50. A Peltier cooler, comprising thermoelectric elements of any one of clauses 37 through 46 with reference to clause 47 and thermoelectric elements of any one of clauses 37 through 46 with reference to clause 48, wherein the first metallisation pads and the second metallisation pads are electrically connected in series such that an alternating series of the planar thermoelectric layers having n-type conductivity and the planar thermoelectric layers having p-type conductivity is built.

Clause 51. A method for manufacturing of a thermoelectric generator, the method comprising electrically connecting the first metallisation pads and the second metallisation pads of the thermoelectric elements of any one of clauses 37 through 46 with reference to clause 47 and the thermoelectric elements of any one of the clauses 37 through 46 with reference to clause 48 such that an alternating series of the planar thermoelectric layers having n-type conductivity and the planar thermoelectric layers having p-type conductivity is built.

Clause 52. A method for manufacturing of a Peltier cooler, the method comprising electrically connecting the first metallisation pads and the second metallisation pads of the thermoelectric elements of any one of clauses 37 through 46 with reference to clause 47 and the thermoelectric elements of any one of clauses 37 through 46 with reference to clause 48 such that an alternating series of the planar thermoelectric layers having n-type conductivity and the planar thermoelectric layers having p-type conductivity is built.

The invention claimed is:

1. A thermoelectric element, comprising:
a dielectric substrate having a hole, wherein the hole has a first opening on a first side of the dielectric substrate and a second opening on a second side of the dielectric substrate;
a first metallisation pad and a second metallisation pad on the first side, wherein the first opening is between the first metallisation pad and the second metallisation pad;

a third metallisation pad and a fourth metallisation pad on the second side, wherein the second opening is between the third metallisation pad and the fourth metallisation pad;
a first thermoelectric layer being in direct contact with the first metallisation pad and the second metallisation pad;
a second thermoelectric layer being in direct contact with the third metallisation pad and the fourth metallisation pad, wherein the first thermoelectric layer and the second thermoelectric layer have different conductivity types, contact with each other via the hole and thereby build a p-n or p-i-n junction.

2. The thermoelectric element of claim 1, wherein the first thermoelectric layer is between the first metallisation pad and the first side of the dielectric substrate and between the second metallisation pad and the first side of the dielectric substrate, wherein the second thermoelectric layer is between the third metallisation pad and the second side of the dielectric substrate and between the fourth metallisation pad and the second side of the dielectric substrate.

3. The thermoelectric element of claim 1, wherein the first metallisation pad is between the first thermoelectric layer and the first side of the dielectric substrate and the second metallisation pad is between the first thermoelectric layer and the first side of the dielectric substrate, wherein the third metallisation pad is between the second thermoelectric layer and the second side of the dielectric substrate and the fourth metallisation pad is between the second thermoelectric layer and the second side of the dielectric substrate.

4. The thermoelectric element of claim 1, wherein the first metallisation pad has a first sidewall facing a second sidewall of the second metallisation pad, wherein the first sidewall and the second sidewall are separated by the first opening, wherein the first sidewall and/or the second sidewall are tapered and/or wherein a contour of the first sidewall on the first side and/or a contour of the second sidewall of the first side are spaced from the first opening.

5. The thermoelectric element of claim 1, wherein the hole is tapered outwards from an interface between the first thermoelectric layer and the second thermoelectric layer as a distance from the interface increases.

6. The thermoelectric element of claim 1, wherein a dopant concentration in the first thermoelectric layer increases in a direction from an interface between the first thermoelectric layer and the second thermoelectric layer.

7. The thermoelectric element of claim 6, wherein said direction is perpendicular to a plane of the interface.

8. The thermoelectric element of claim 1, wherein a dopant concentration in the second thermoelectric layer increases in a direction from an interface between the first thermoelectric layer and the second thermoelectric layer.

9. The thermoelectric element of claim 8, wherein said direction is perpendicular to a plane of the interface.

10. The thermoelectric element claim 1, wherein the first thermoelectric layer comprises a first portion adjacent to an interface between the first thermoelectric layer and the second thermoelectric layer, and a second portion adjacent to the first portion and the first and the second metallisation pad, wherein the first portion has lower dopant concentration averaged over volume than the second portion or the first portion is made of one or more thermoelectric materials each having lower charge carrier concentration than each of one or more thermoelectric materials used for manufacturing of the second portion.

11. The thermoelectric element of claim 1, wherein the hole is a slit having one of the following shapes: a rectangular slit, a meander-shaped slit, a sawtooth-shaped slit, or a wave-shaped slit.

12. The thermoelectric element of claim 1, wherein a material of the first thermoelectric layer has a lower thermal and/or electrical conductivity than a material of the second thermoelectric layer, wherein an interface between the first thermoelectric layer and the second thermoelectric layer is positioned closer to first side than to the second side of the dielectric substrate and/or the first thermoelectric layer is thicker than the second thermoelectric layer.

13. A thermoelectric element, comprising:
a dielectric substrate having a hole, wherein the hole has a first opening on a first side of the dielectric substrate and a second opening on a second side of the dielectric substrate;
a first metallisation pad and a second metallisation pad on the first side, wherein the first opening is between the first metallisation pad and the second metallisation pad;
a third metallisation pad and a fourth metallisation pad on the second side, wherein the second opening is between the third metallisation pad and the fourth metallisation pad;
a first semiconductor layer being in direct contact with the first metallisation pad and the second metallisation pad;
a second semiconductor layer being in direct contact with the third metallisation pad and the fourth metallisation pad, wherein the first semiconductor layer and the second semiconductor layer have different conductivity types, contact with each other via the hole and thereby build a p-n or p-i-n junction.

14. The thermoelectric element of claim 13, wherein the first metallisation pad has a first sidewall facing a second sidewall of the second metallisation pad, wherein the first sidewall and the second sidewall are separated by the first opening, wherein the first sidewall and/or the second sidewall are tapered and/or wherein a contour of the first sidewall on the first side and/or a contour of the second sidewall of the first side are spaced from the first opening.

15. The thermoelectric element of claim 13, wherein the hole is tapered outwards from an interface between the first semiconductor layer and the second semiconductor layer as a distance from the interface increases.

16. The thermoelectric element of claim 13, wherein the first semiconductor layer is between the first metallisation pad and the first side of the dielectric substrate and between the second metallisation pad and the first side of the dielectric substrate, wherein the second semiconductor layer is between the third metallisation pad and the second side of the dielectric substrate and between the fourth metallisation pad and the second side of the dielectric substrate.

17. The thermoelectric element of claim 13, wherein the first metallisation pad is between the first semiconductor layer and the first side of the dielectric substrate and the second metallisation pad is between the first semiconductor layer and the first side of the dielectric substrate, wherein the third metallisation pad is between the second semiconductor layer and the second side of the dielectric substrate and the fourth metallisation pad is between the second semiconductor layer and the second side of the dielectric substrate.

18. The thermoelectric element of claim 13, wherein the hole is a slit having one of the following shapes: a rectangular slit, a meander-shaped slit, a sawtooth-shaped slit, or a wave-shaped slit.

19. The thermoelectric element of claim 13, wherein a material of the first semiconductor layer has a lower thermal and/or electrical conductivity than a material of the second semiconductor layer, wherein an interface between the first semiconductor layer and the second semiconductor layer is positioned closer to first side than to the second side of the dielectric substrate and/or the first semiconductor layer is thicker than the second semiconductor layer.

20. A method for manufacturing a thermoelectric element, the method comprising:
at least partially filling a hole of a dielectric substrate with a sacrificial material, wherein the hole has a first opening on a first side of the dielectric substrate and a second opening on a second side of the dielectric substrate, wherein a first metallisation pad and a second metallisation pad are arranged on the first side, wherein the first opening is between the first metallisation pad and the second metallisation pad, wherein a third metallisation pad and a fourth metallisation pad are arranged on the second side, wherein the second opening is between the third metallisation pad and the fourth metallisation pad;
forming a first semiconductor layer on the sacrificial material and in direct contact with the first metallisation pad and the second metallisation pad;
removing the sacrificial material; and
forming a second semiconductor layer on the second side of the dielectric substrate, wherein the second semiconductor layer is formed in the hole such that it contacts directly the first semiconductor layer thereby building a p-n or p-i-n junction, wherein the second semiconductor layer is in direct contact with the third metallisation pad and the fourth metallisation pad.

* * * * *